(12) United States Patent
Seo

(10) Patent No.: US 8,994,013 B2
(45) Date of Patent: Mar. 31, 2015

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventor: Satoshi Seo, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/892,667

(22) Filed: May 13, 2013

(65) Prior Publication Data

US 2013/0306945 A1 Nov. 21, 2013

(30) Foreign Application Priority Data

May 18, 2012 (JP) ................................ 2012-114276

(51) Int. Cl.
*H01L 51/50* (2006.01)

(52) U.S. Cl.
CPC ........ *H01L 51/5072* (2013.01); *H01L 51/5056* (2013.01); *H01L 51/5016* (2013.01)
USPC ............................... 257/40; 257/89; 257/103

(58) Field of Classification Search
CPC ............ H01L 51/5016; H01L 51/5012; H01L 51/502; H01L 51/5024; H01L 51/5036; H01L 51/5056; H01L 51/5072; H05B 33/14; C09K 11/06
USPC ................ 257/40, 79, 89, 103; 428/690, 917; 438/34, 35, 99
See application file for complete search history.

(56) References Cited

U.S. PATENT DOCUMENTS 5,409,783 A 4/1995 Tang et al.
5,420,288 A 5/1995 Ohta et al.
(Continued)

FOREIGN PATENT DOCUMENTS

CN 001447629 A 10/2003
EP 1351558 A 10/2003
(Continued)

OTHER PUBLICATIONS

Ayataka Endo, Keigo Sato, Kazuaki Yoshimura, Takahiro Kai, Atsushi Kawada, Hiroshi Miyazaki, and Chihaya Adachi, "Efficient up-conversion of triplet excitons into a singlet state and its application for organic light emitting diodes", Feb. 24, 2011, Applied Physics Letters 98, 083302.*

(Continued)

*Primary Examiner* — Colleen A Matthews
*Assistant Examiner* — Quovaunda V Jefferson
(74) *Attorney, Agent, or Firm* — Eric J. Robinson; Robinson Intellectual Property Law Office, P.C.

(57) ABSTRACT

An object is to provide a light-emitting element which includes an exciplex being used as an energy donor capable of efficiently transferring energy to a substance exhibiting thermally activated delayed fluorescence. The exciplex comprises two kinds of substances and its singlet and triplet excited states are close to each other. Thus, by making light emission of the exciplex overlap with an absorption band on the longest wavelength side which corresponds to absorption by the substance exhibiting thermally activated delayed fluorescence, i.e., an energy acceptor, in a singlet excited state, it becomes possible to achieve efficient energy transfer from a singlet excited state of the exciplex to a singlet excited state of the substance exhibiting thermally activated delayed fluorescence, and it also becomes possible to achieve efficient energy transfer from a triplet excited state of the exciplex to a triplet excited state of the substance exhibiting thermally activated delayed fluorescence.

14 Claims, 20 Drawing Sheets

(56) References Cited

U.S. PATENT DOCUMENTS

| | | | |
|---|---|---|---|
| 5,597,890 A | 1/1997 | Jenekhe | |
| 5,597,925 A | 1/1997 | Ohta et al. | |
| 5,610,309 A | 3/1997 | Ohta et al. | |
| 5,656,401 A | 8/1997 | Ohta et al. | |
| 5,709,492 A | 1/1998 | Yasunaga et al. | |
| 6,097,147 A | 8/2000 | Baldo et al. | |
| 6,863,997 B2 | 3/2005 | Thompson et al. | |
| 6,869,695 B2 | 3/2005 | Thompson et al. | |
| 6,951,694 B2 | 10/2005 | Thompson et al. | |
| 7,175,922 B2 | 2/2007 | Jarikov et al. | |
| 7,183,010 B2 | 2/2007 | Jarikov | |
| 7,553,557 B2 | 6/2009 | Thompson et al. | |
| 7,572,522 B2 | 8/2009 | Seo et al. | |
| 7,597,967 B2 * | 10/2009 | Kondakova et al. | 428/690 |
| 7,700,148 B2 * | 4/2010 | Steudel et al. | 427/66 |
| 7,943,925 B2 | 5/2011 | Yamazaki | |
| 8,247,086 B2 | 8/2012 | Inoue et al. | |
| 2003/0189401 A1 | 10/2003 | Kido et al. | |
| 2004/0076853 A1 | 4/2004 | Jarikov | |
| 2005/0048310 A1 | 3/2005 | Cocchi et al. | |
| 2005/0064237 A1 | 3/2005 | Kato et al. | |
| 2005/0106415 A1 | 5/2005 | Jarikov et al. | |
| 2005/0196775 A1 | 9/2005 | Swager et al. | |
| 2006/0134464 A1 | 6/2006 | Nariyuki | |
| 2006/0228577 A1 | 10/2006 | Nagara | |
| 2007/0222374 A1 | 9/2007 | Egawa et al. | |
| 2007/0244320 A1 | 10/2007 | Inoue et al. | |
| 2007/0247829 A1 | 10/2007 | Fiedler et al. | |
| 2008/0160345 A1 | 7/2008 | Inoue et al. | |
| 2008/0217604 A1 | 9/2008 | Yokoyama et al. | |
| 2008/0286604 A1 | 11/2008 | Inoue et al. | |
| 2009/0306296 A1 * | 12/2009 | Nanba et al. | 525/200 |
| 2010/0051968 A1 * | 3/2010 | Seo et al. | 257/87 |
| 2010/0052527 A1 | 3/2010 | Ikeda et al. | |
| 2010/0099730 A1 * | 4/2010 | Laufer et al. | 514/413 |
| 2010/0123389 A1 * | 5/2010 | Takasu et al. | 313/504 |
| 2010/0145044 A1 | 6/2010 | Inoue et al. | |
| 2010/0184942 A1 | 7/2010 | Chen et al. | |
| 2011/0001146 A1 | 1/2011 | Yamazaki et al. | |
| 2011/0210316 A1 | 9/2011 | Kadoma et al. | |
| 2011/0215714 A1 | 9/2011 | Seo et al. | |
| 2012/0098417 A1 | 4/2012 | Inoue et al. | |
| 2012/0205632 A1 | 8/2012 | Shitagaki et al. | |
| 2012/0205687 A1 | 8/2012 | Yamazaki et al. | |
| 2012/0206035 A1 | 8/2012 | Shitagaki et al. | |
| 2012/0217486 A1 | 8/2012 | Takemura et al. | |
| 2012/0217487 A1 | 8/2012 | Yamazaki et al. | |
| 2012/0242219 A1 | 9/2012 | Seo et al. | |
| 2012/0248421 A1 | 10/2012 | Yamazaki et al. | |
| 2012/0256535 A1 | 10/2012 | Seo et al. | |
| 2012/0267618 A1 | 10/2012 | Monkman et al. | |
| 2013/0048964 A1 | 2/2013 | Takeda et al. | |
| 2013/0161598 A1 * | 6/2013 | Inoue et al. | 257/40 |
| 2013/0240851 A1 | 9/2013 | Seo et al. | |

FOREIGN PATENT DOCUMENTS

| | | | |
|---|---|---|---|
| EP | 1718122 A | 11/2006 | |
| EP | 2363398 A | 9/2011 | |
| EP | 2366753 A | 9/2011 | |
| JP | 07-085972 A | 3/1995 | |
| JP | 07-142169 A | 6/1995 | |
| JP | 10-003990 A | 1/1998 | |
| JP | 2003-272860 A | 9/2003 | |
| JP | 2004-241374 A | 8/2004 | |
| JP | 2006-024830 A | 1/2006 | |
| JP | 2006-203172 A | 8/2006 | |
| JP | 2007-073620 A | 3/2007 | |
| JP | 2009-108096 A | 5/2009 | |
| JP | 2010-135689 A | 6/2010 | |
| JP | 2010-182699 A | 8/2010 | |
| JP | 2011-153269 A | 8/2011 | |
| JP | 2011-201869 A | 10/2011 | |
| JP | 2011-204673 A | 10/2011 | |
| JP | 2011-216628 A | 10/2011 | |
| JP | 2012-004526 A | 1/2012 | |
| KR | 2004-0019177 A | 3/2004 | |
| KR | 2011-0099645 A | 9/2011 | |
| TW | I271119 | 1/2007 | |
| WO | WO-00/70655 | 11/2000 | |
| WO | WO-2005/079118 | 8/2005 | |

OTHER PUBLICATIONS

Baldo.M et al., "Highly Efficient Phosphorescent Emission From Organic Electroluminescent Devices," Nature, Sep. 10, 1998, vol. 395, pp. 151-154.

Baldo.M et al., "Very High-Efficiency Green Organic Light-Emitting Devices Based on Electrophosphorescence," Appl. Phys. Lett. (Applied Physics Letters), Jul. 5, 1999, vol. 75, No. 1, pp. 4-6.

Gu.G et al., "Transparent Organic Light Emitting Devices," Appl. Phys. Lett. (Applied Physics Letters), May 6, 1996, vol. 68, No. 19, pp. 2606-2608.

Choong.V et al., "Organic Light-Emitting Diodes With a Bipolar Transport Layer," Appl. Phys. Lett. (Applied Physics Letters), Jul. 12, 1999, vol. 75, No. 2, pp. 172-174.

Adachi.C et al., "Nearly 100% Internal Phosphorescence Efficiency in an Organic Light Emitting Device," J. Appl. Phys. (Journal of Applied Physics), Nov. 15, 2001, vol. 90, No. 10, pp. 5048-5051.

Baldo.M et al., "Prospects for Electrically Pumped Organic Lasers," Phys. Rev. B (Physical Review. B), Jul. 19, 2002, vol. 66, pp. 035321-1-035321-16.

Markham.J et al., "High-efficiency green phosphorescence from spin-coated single-layer dendrimer light-emitting diodes," Appl. Phys. Lett. (Applied Physics Letters), Apr. 15, 2002, vol. 80, No. 15, pp. 2645-2647.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials," Appl. Phys. Lett. (Applied Physics Letters), Feb. 9, 1998, vol. 72, No. 6, pp. 636-638.

Kondakova.M et al., "High-efficiency, low-voltage phosphorescent organic light-emitting diode devices with mixed host," J. Appl. Phys. (Journal of Applied Physics), 2008, vol. 104, pp. 094501-1-094501-17.

Seo.J et al., "Efficient blue-green organic light-emitting diodes based on heteroleptic tris-cyclometalated iridium(III) complexes," Thin Solid Films, 2009, vol. 517, No. 5, pp. 1807-1810.

Fujita.M et al., "Reduction of operating voltage in organic light-emitting diode by corrugated photonic crystal structure," Appl. Phys. Lett. (Applied Physics Letters), Dec. 6, 2004, vol. 85, No. 23, pp. 5769-5771.

King.K et al., "Excited-state properties of a triply ortho-metalated iridium(III) complex", J. Am. Chem. Soc. (Journal of the American Chemical Society), Mar. 1, 1985, vol. 107, No. 5, pp. 1431-1432, ACS(American Chemical Society).

Hino.Y et al., "Red Phosphorescent Organic Light-Emitting Diodes Using Mixture System of Small-Molecule and Polymer Host", Jpn. J. Appl. Phys. (Japanese Journal of Applied Physics) , 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemial Society), 2003, vol. 125, No. 42, pp. 12971-12979.

* cited by examiner

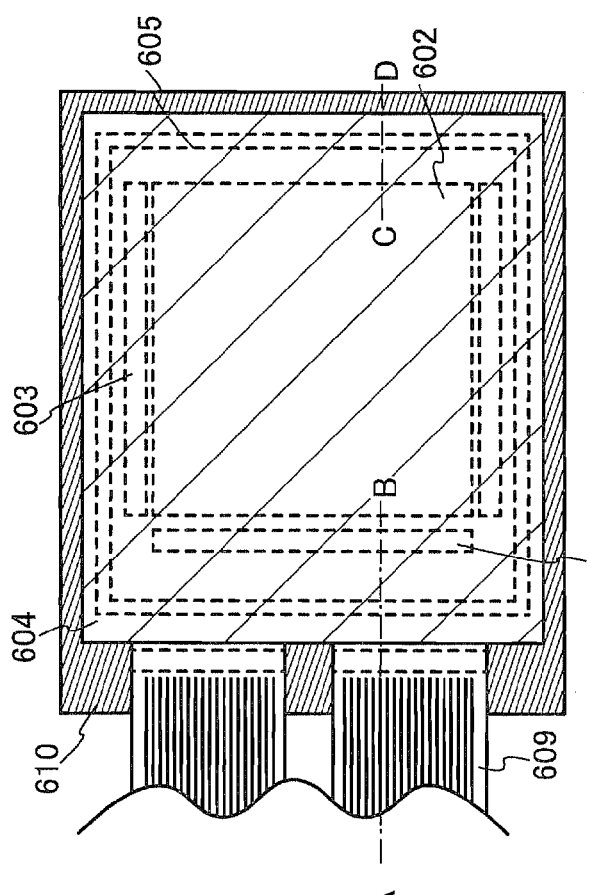
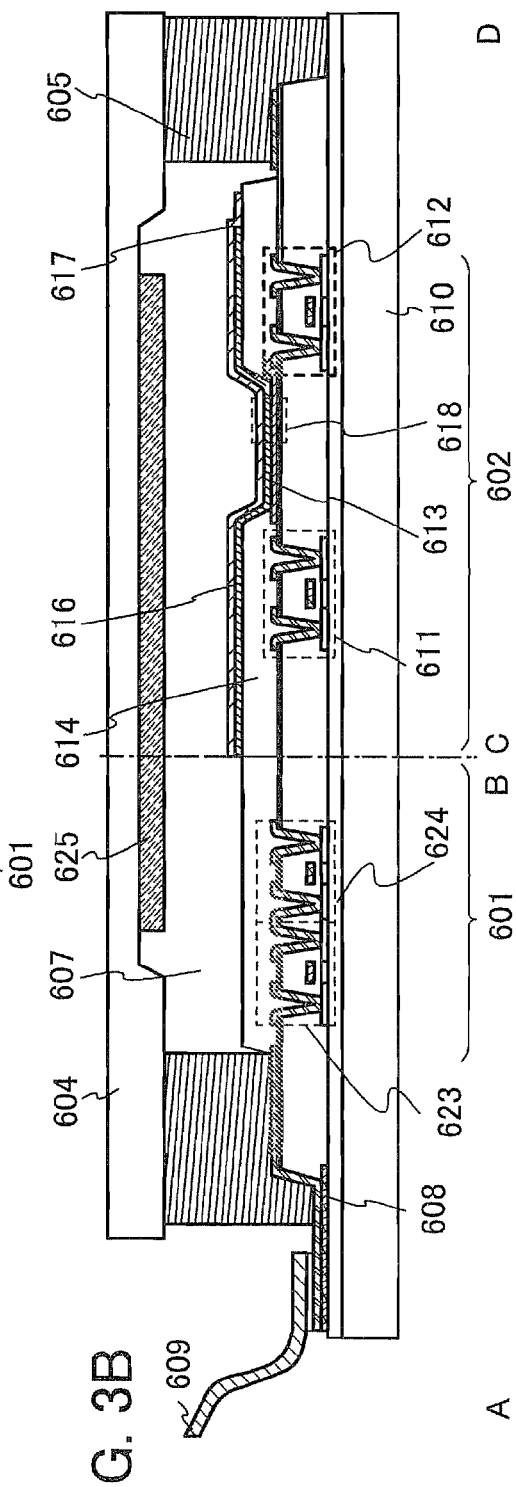
FIG. 3A
FIG. 3B

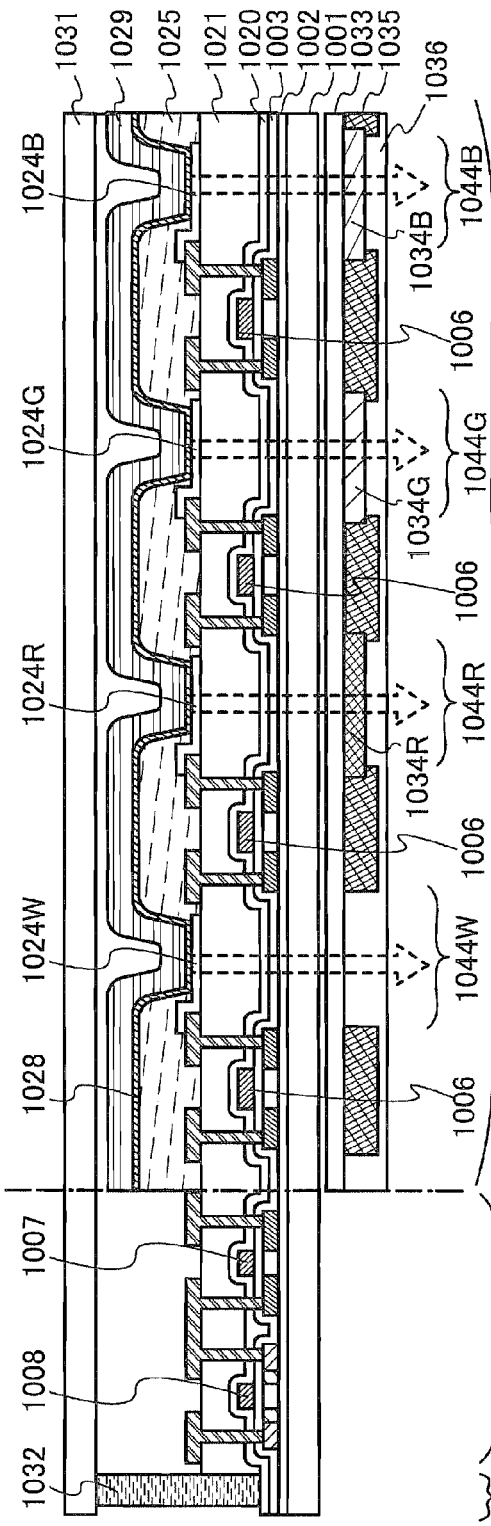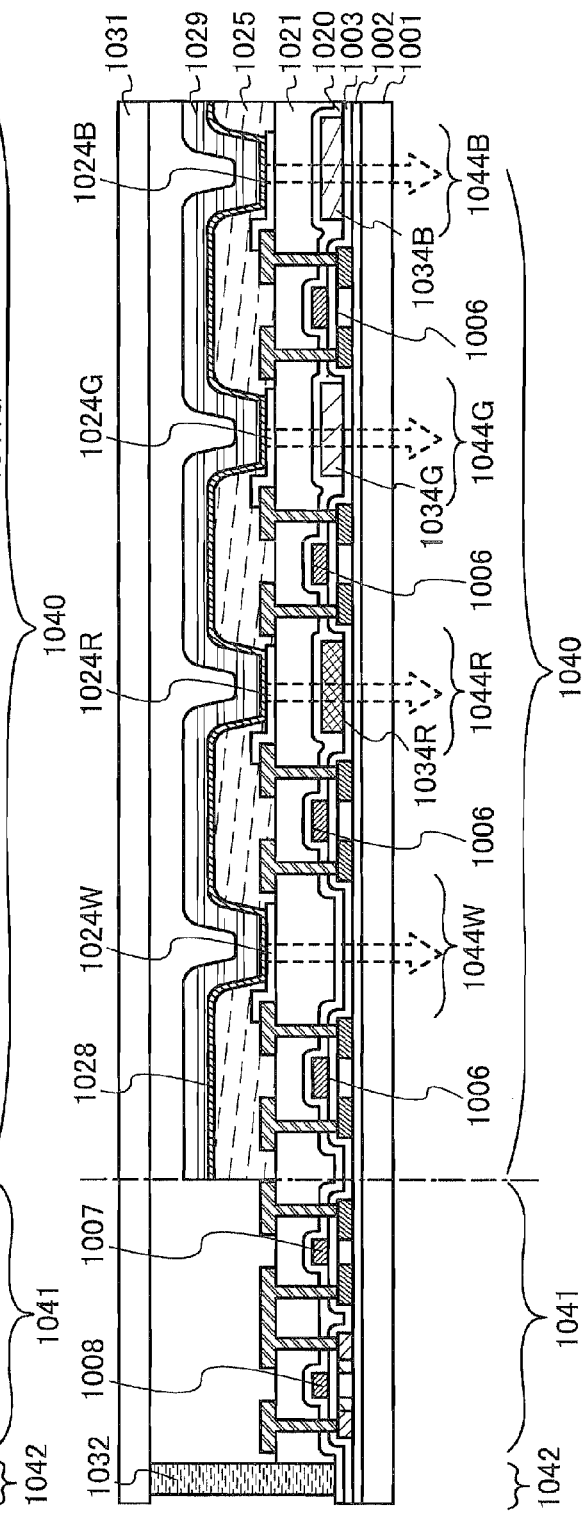
FIG. 5A
FIG. 5B

FIG. 8A
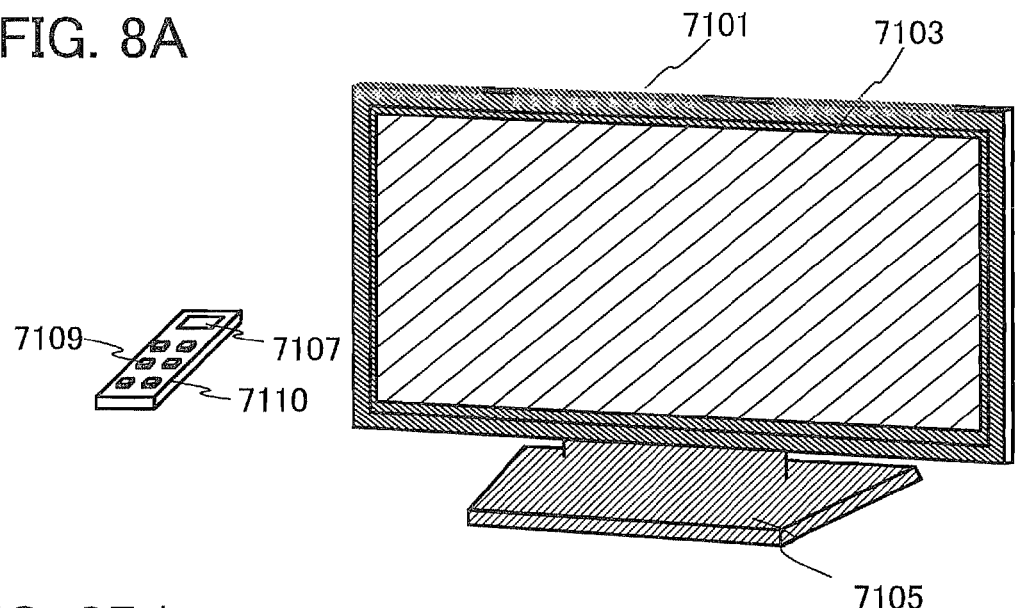
FIG. 8B1
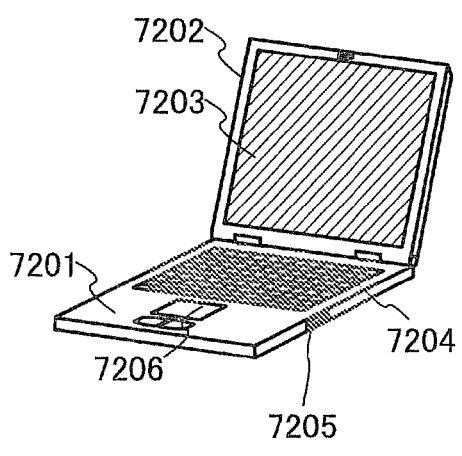
FIG. 8B2
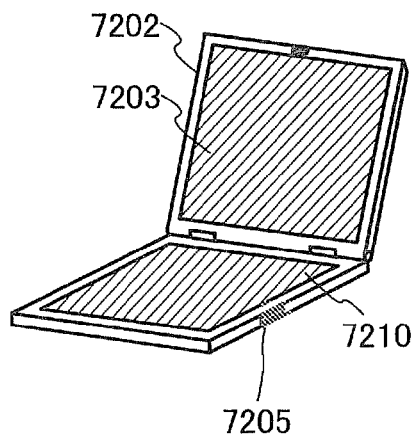
FIG. 8C
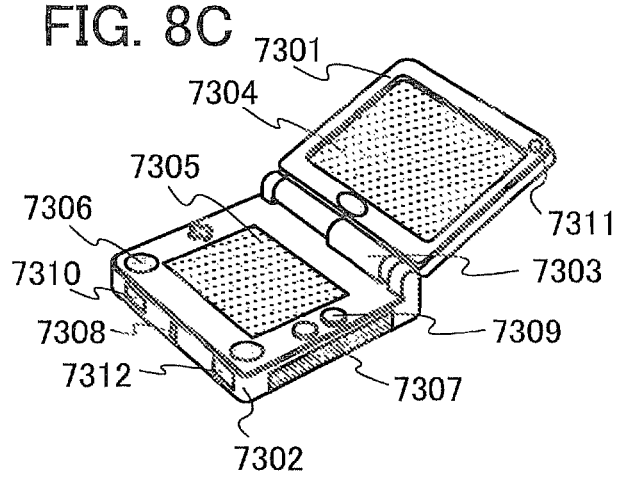
FIG. 8D
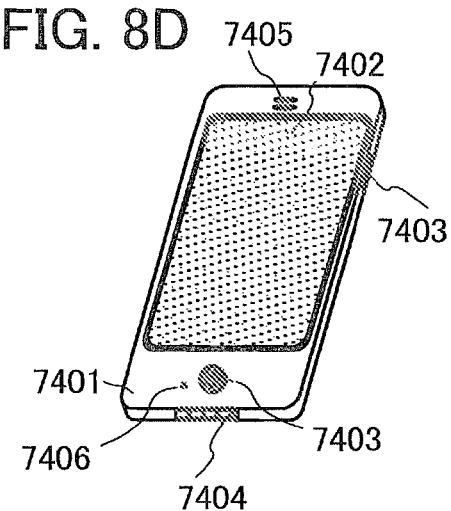

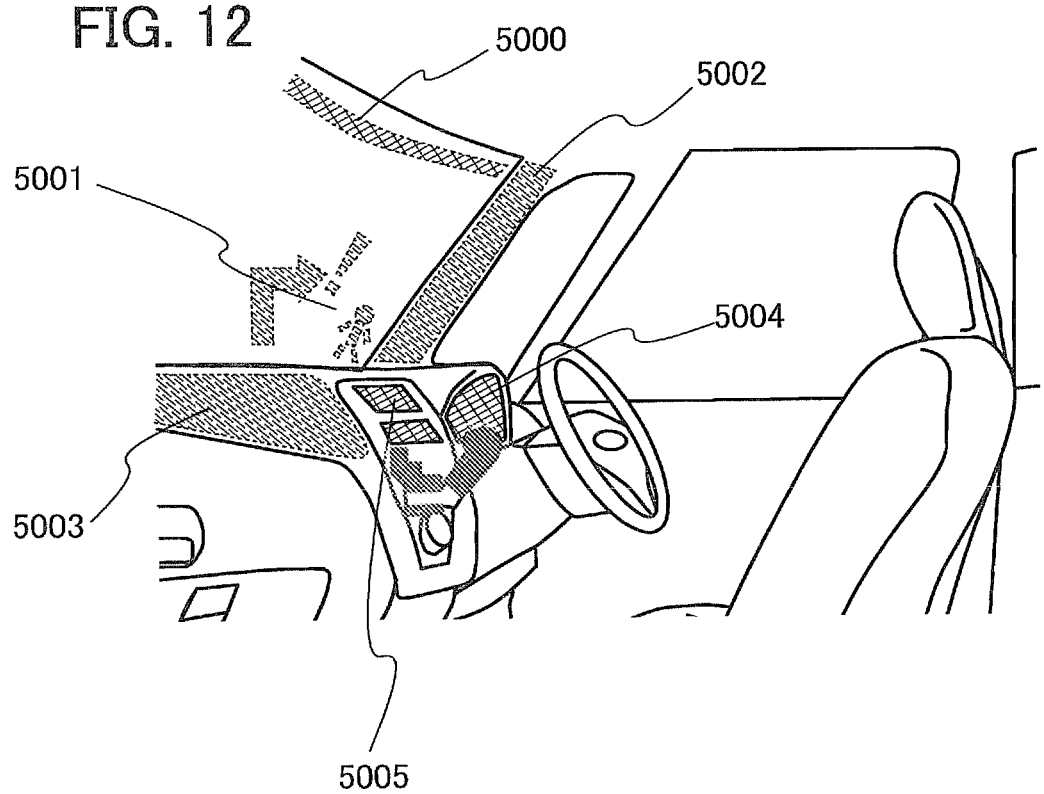

LIGHT-EMITTING ELEMENT, LIGHT-EMITTING DEVICE, DISPLAY DEVICE, ELECTRONIC DEVICE, AND LIGHTING DEVICE

BACKGROUND OF THE INVENTION

1. Field of the Invention

The present invention relates to a light-emitting element, a display device, a light-emitting device, an electronic device, and a lighting device each of which includes an organic compound as a light-emitting substance.

2. Description of the Related Art

In recent years, research and development have been extensively conducted on light-emitting elements using electroluminescence (EL). In a basic structure of such a light-emitting element, a layer containing a light-emitting substance (an EL layer) is interposed between a pair of electrodes. By applying voltage to this element, light emission from the light-emitting substance can be obtained.

Since such a light-emitting element is of self-light-emitting type, the light-emitting element has advantages over a liquid crystal display in that visibility of pixels is high, backlight is not required, and so on and is therefore suitable as flat panel display elements. In addition, it is also a great advantage that a display including such a light-emitting element can be manufactured as a thin and lightweight display. Furthermore, very high speed response is also one of the features of such an element.

Since a light-emitting layer of such a light-emitting element can be formed in the form of a film, planar light emission can be achieved. Therefore, large-area light sources can be easily formed. This feature is difficult to obtain with point light sources typified by incandescent lamps and LEDs or linear light sources typified by fluorescent lamps. Thus, light-emitting elements also have great potential as planar light sources which can be applied to lighting devices and the like.

In the case of an organic EL element in which an EL layer containing an organic compound as the light-emitting substance is provided between a pair of electrodes, application of a voltage between the pair of electrodes causes injection of electrons from the cathode and holes from the anode into the EL layer having a light-emitting property, and thus a current flows. By recombination of the injected electrons and holes, the organic compound having a light-emitting property is put in an excited state to provide light emission.

The excited state of an organic compound can be a singlet excited state or a triplet excited state, and light emission from the singlet excited state (S*) is referred to as fluorescence, and light emission from the triplet excited state (T*) is referred to as phosphorescence. The statistical generation ratio of the excited states in the light-emitting element is considered to be S*:T*=1:3. Therefore, a light-emitting element including a phosphorescent compound capable of converting the triplet excited state into light emission has been actively developed in recent years.

However, most phosphorescent compounds currently available are complexes containing a rare metal such as iridium as a central metal, which raises concern about the cost and the stability of supply. Therefore, as materials which do not contain a rare metal and can convert a triplet excited state into light emission, materials exhibiting delayed fluorescence have been studied.

Patent Documents 1 and 2 disclose a material exhibiting thermally activated delayed fluorescence (TADF) (hereinafter also referred to as a TADF material) with relatively high efficiency even at low temperature.

REFERENCE

[Patent Document 1] Japanese Published Patent Application No. 2004-241374
[Patent Document 2] Japanese Published Patent Application No. 2006-024830

SUMMARY OF THE INVENTION

For a layer responsible for light emission in a light-emitting element, a so-called host-guest structure in which a light-emitting substance is dispersed as guest molecules in host molecules is commonly employed, for the purpose of preventing concentration quenching or controlling the light-emitting position or for reasons such as poor film quality of a light-emitting substance or the like. In that case, electron-hole recombination occurs partly in the light-emitting substance but mainly in a host material. In order to improve emission efficiency, energy transfer from host molecules to guest molecules should be taken into consideration.

However, the TADF material disclosed in Patent Documents 1 and 2, in which TADF occurs with high efficiency, differs from ordinary light-emitting substances and host molecules in the positional relationship between single and triplet excited states; the singlet and triplet excited states of the TADF material are close to each other. Therefore, efficient energy transfer is difficult to achieve using ordinary host molecules.

In view of the above, an object of one embodiment of the present invention is to provide a light-emitting element which includes a TADF material as a light-emitting substance and has high emission efficiency. Another object of one embodiment of the present invention is to provide a light-emitting device, a display device, an electronic device, and a lighting device each having reduced power consumption by using the above light-emitting element.

It is only necessary that at least one of the above objects be achieved in the present invention.

The present invention provides a light-emitting element in which an exciplex (an excited complex) is used as an energy donor capable of efficiently transferring energy to a substance exhibiting thermally activated delayed fluorescence. The exciplex is formed from two kinds of substances and is characterized in that its singlet and triplet excited states are close to each other. Thus, by making light emission of the exciplex overlap with an absorption band on the longest wavelength side which corresponds to absorption by the substance exhibiting thermally activated delayed fluorescence, i.e., an energy acceptor, in a singlet excited state, it becomes possible to achieve efficient energy transfer from a singlet excited state of the exciplex to a singlet excited state of the substance exhibiting thermally activated delayed fluorescence, and it also becomes possible to achieve efficient energy transfer from a triplet excited state of the exciplex to a triplet excited state of the substance exhibiting thermally activated delayed fluorescence.

That is, one embodiment of the present invention is a light-emitting element which includes a pair of electrodes and an EL layer between the pair of electrodes. The EL layer includes at least a light-emitting layer. The light-emitting layer contains at least a first organic compound, a second organic compound, and a light-emitting substance. A combination of the first organic compound and the second organic compound forms an exciplex. The light-emitting substance exhibits thermally activated delayed fluorescence.

Another embodiment of the present invention is a light-emitting element which includes a pair of electrodes and an EL layer between the pair of electrodes. The EL layer includes at least a light-emitting layer. The light-emitting layer contains at least a first organic compound, a second organic compound, and a light-emitting substance. A combination of the first organic compound and the second organic compound forms an exciplex. The light-emitting substance exhibits thermally activated delayed fluorescence. An absorption band, on the lowest energy side, of the substance exhibiting thermally activated delayed fluorescence overlaps with a light emission spectrum of the exciplex.

Another embodiment of the present invention is a light-emitting element having the above structure, in which the difference in equivalent energy value between a peak wavelength in the absorption band, on the lowest energy side, of the substance exhibiting thermally activated delayed fluorescence and a peak wavelength of the light emission of the exciplex is 0.2 eV or less.

Another embodiment of the present invention is a light-emitting element having the above structure, in which the difference in equivalent energy value between peak wavelengths of fluorescent light emission and phosphorescent light emission of the substance exhibiting thermally activated delayed fluorescence is 0.2 eV or less.

Another embodiment of the present invention is a light-emitting element having the above structure, in which the difference in equivalent energy value between peak wavelengths of fluorescent light emission and phosphorescent light emission of the exciplex is 0.2 eV or less.

Another embodiment of the present invention is a light-emitting element having the above structure, in which the substance exhibiting thermally activated delayed fluorescence is a heterocyclic compound having a π-electron rich heteroaromatic ring and a π-electron deficient heteroaromatic ring.

Another embodiment of the present invention is a light-emitting element having the above structure, in which the substance exhibiting thermally activated delayed fluorescence is a heterocyclic compound having a π-electron rich heteroaromatic ring and a π-electron deficient heteroaromatic ring which are directly bonded to each other.

Another embodiment of the present invention is a light-emitting device, a display device, an electronic device, and a lighting device each including a light-emitting element having the above structure.

Note that the light-emitting device in this specification includes, in its category, an image display device with a light-emitting element. Further, the category of the light-emitting device in this specification includes a module in which a light-emitting element is provided with a connector such as an anisotropic conductive film or a TCP (tape carrier package); a module in which the end of the TCP is provided with a printed wiring board; and a module in which an IC (integrated circuit) is directly mounted on a light-emitting element by a COG (chip on glass) method. Furthermore, the category includes light-emitting devices that are used in lighting equipment or the like.

One embodiment of the present invention provides a light-emitting element having high emission efficiency. By using the light-emitting element, another embodiment of the present invention provides a light-emitting device, a display device, an electronic device, and a lighting device each having reduced power consumption.

BRIEF DESCRIPTION OF THE DRAWINGS

FIGS. 3A and 3B are schematic diagrams of an active matrix light-emitting device.

FIGS. 5A and 5B are schematic diagrams of an active matrix light-emitting device.

FIGS. 8A, 8B1, 8B2, 8C, and 8D each illustrate an electronic device.

FIG. 12 illustrates in-vehicle display devices and lighting devices.

DETAILED DESCRIPTION OF THE INVENTION

Figure 1A:
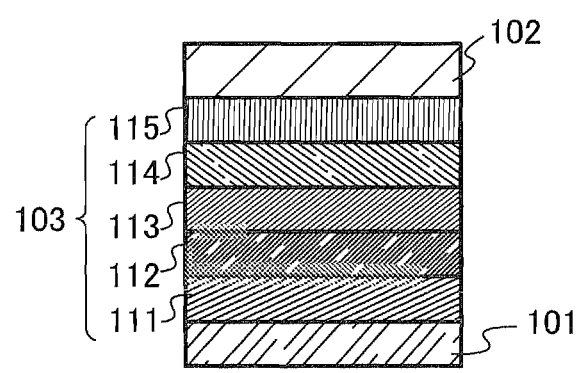
FIGS. 1A and 1B are schematic diagrams of a light-emitting element.

Embodiments of the present invention will be described below with reference to the drawings. Note that the present invention is not limited to the following description, and it will be easily understood by those skilled in the art that various changes and modifications can be made without departing from the spirit and scope of the present invention.

Therefore, the present invention should not be construed as being limited to the description in the following embodiments.

Embodiment 1

In a light-emitting element in which a substance exhibiting thermally activated delayed fluorescence (TADF) is used as a light-emitting substance, light emission occurs through the following energetic process. Note that a molecule providing excitation energy (an energy donor) is referred to as a host molecule, while the substance exhibiting TADF (an energy acceptor) is referred to as a guest molecule.

(1) The case where an electron and a hole are recombined in a guest molecule, and the guest molecule is excited (direct recombination process).

(1-1) When the excited state of the guest molecule is a singlet excited state, the guest molecule emits fluorescence.

(1-2) When the excited state of the guest molecule is a triplet excited state, the guest molecule undergoes reverse intersystem crossing to a singlet excited state by absorbing energy (mainly heat) and emits fluorescence.

In the direct recombination process in (1), when the efficiency of reverse intersystem crossing and the fluorescence quantum yield of the guest molecule are high, high emission efficiency can be obtained. Note that it is preferable that the level of singlet excitation energy ($S_1$ level) and the level of triplet excitation energy ($T_1$ level) of the host molecule be higher than the $S_1$ level and the $T_1$ level of the guest molecule. Regarding the substance exhibiting TADF and having high reverse intersystem crossing efficiency (the guest molecule), the above patent documents and a variety of reports have been published.

(2) The case where an electron and a hole are recombined in a host molecule and the host molecule is put in an excited state (energy transfer process).

(2-1) When the excited state of the host molecule is a singlet excited state and the $S_1$ level of the host molecule is higher than the $S_1$ level of the guest molecule, excitation energy is transferred from the host molecule to the guest molecule, and thus, the guest molecule is put in a singlet excited state. The guest molecule in the singlet excited state emits fluorescence. Note that since direct transition of the guest molecule from a singlet ground state to a triplet excited state is forbidden, energy transfer from the $S_1$ level of the host molecule to the $T_1$ level of the guest molecule is unlikely to be a main energy transfer process; therefore, a description thereof is omitted here. In other words, energy transfer from the host molecule in the singlet excited state ($^1H^*$) to the guest molecule in the singlet excited state ($^1G^*$) is important as represented by Formula (2-1) below (where $^1G$ represents the singlet ground state of the guest molecule and $^1H$ represents the singlet ground state of the host molecule).

$$^1H^* + {^1G} \rightarrow {^1H} + {^1G^*} \tag{2-1}$$

(2-2) When the excited state of the host molecule is a triplet excited state and the $T_1$ level of the host molecule is higher than the $S_1$ level and $T_1$ level of the guest molecule, excitation energy is transferred from the $T_1$ level of the host molecule to the $T_1$ level of the guest molecule, and thus, the guest molecule is put in a triplet excited state. The guest molecule in the triplet excited state undergoes reverse intersystem crossing by absorbing thermal energy and emits fluorescence.

In other words, as in Formula (2-2) below, energy is transferred from the host molecule in the triplet excited state ($^3H^*$) to the guest molecule in the triplet excited state ($^3G^*$), and then the singlet excited state ($^1G^*$) of the guest molecule is generated by reverse intersystem crossing.

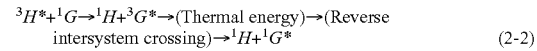

$$^3H^* + {^1G} \rightarrow {^1H} + {^3G^*} \rightarrow (\text{Thermal energy}) \rightarrow (\text{Reverse intersystem crossing}) \rightarrow {^1H} + {^1G^*} \tag{2-2}$$

When all the energy transfer processes described above in (2) occur efficiently, both the triplet excitation energy and the singlet excitation energy of the host molecule are efficiently converted into the singlet excited state ($^1G^*$) of the guest molecule. Thus, high-efficiency light emission is possible. In contrast, before the excitation energy of the host molecule is transferred to the guest molecule, when the host molecule itself is deactivated by emitting the excitation energy as light or heat, the emission efficiency is decreased.

Next, factors controlling the above-described processes of intermolecular energy transfer between the host molecule and the guest molecule are described. As mechanisms of the intermolecular energy transfer, two mechanisms, i.e., Förster mechanism and Dexter mechanism, have been proposed.

In Förster mechanism (dipole-dipole interaction), energy transfer does not require direct contact between molecules and energy is transferred through a resonant phenomenon of dipolar oscillation between a host molecule and a guest molecule. By the resonant phenomenon of dipolar oscillation, the host molecule provides energy to the guest molecule, and thus, the host molecule is put in a ground state and the guest molecule is put in an excited state. Note that the rate constant $k_{h^* \rightarrow g}$ of Förster mechanism is expressed by Formula (1).

[Formula 1]

$$k_{h^* \rightarrow g} = \frac{9000 c^4 K^2 \phi \ln 10}{128 \pi^5 n^4 N \tau R^6} \int \frac{f'_h(\nu) \varepsilon_g(\nu)}{\nu^4} d\nu \tag{1}$$

In Formula (1), $\nu$ denotes a frequency, $f'_h(\nu)$ denotes a normalized emission spectrum of a host molecule (a fluorescent spectrum in energy transfer from a singlet excited state, and a phosphorescent spectrum in energy transfer from a triplet excited state), $\varepsilon_g(\nu)$ denotes a molar absorption coefficient of a guest molecule, N denotes Avogadro's number, n denotes a refractive index of a medium, R denotes an intermolecular distance between the host molecule and the guest molecule, $\tau$ denotes a measured lifetime of an excited state (fluorescence lifetime or phosphorescence lifetime), c denotes the speed of light, $\phi$ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host molecule and the guest molecule. Note that $K^2 = 2/3$ in random orientation.

In Dexter mechanism (electron exchange interaction), a host molecule and a guest molecule are close to a contact effective range where their orbitals overlap, and the host molecule in an excited state and the guest molecule in a ground state exchange their electrons, which leads to energy transfer. Note that the rate constant $k_{h^* \rightarrow g}$ of Dexter mechanism is expressed by Formula (2).

[Formula 2]

$$k_{h^* \rightarrow g} = \left( \frac{2\pi}{h} \right) K^2 \exp\left( -\frac{2R}{L} \right) \int f'_h(\nu) \varepsilon'_g(\nu) d\nu \tag{2}$$

In Formula (2), h denotes a Planck constant, K' denotes a constant having an energy dimension, $\nu$ denotes a frequency, $f'_h(\nu)$ denotes a normalized emission spectrum of a host molecule (a fluorescent spectrum in energy transfer from a singlet excited state, and a phosphorescent spectrum in energy transfer from a triplet excited state), $\epsilon'_g(\nu)$ denotes a normalized absorption spectrum of a guest molecule, L denotes an effective molecular radius, and R denotes an intermolecular distance between the host molecule and the guest molecule.

Here, the efficiency of energy transfer from the host molecule to the guest molecule (energy transfer efficiency $\Phi_{ET}$) is thought to be expressed by Formula (3). In the formula, $k_r$ denotes a rate constant of a light-emission process (fluorescence in energy transfer from a singlet excited state, and phosphorescence in energy transfer from a triplet excited state) of a host molecule, $k_n$ denotes a rate constant of a non-light-emission process (thermal deactivation or intersystem crossing) of a host molecule, and $\tau$ denotes a measured lifetime of an excited state of a host molecule.

[Formula 3]

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\Phi_{ET}$ can be increased by increasing the rate constant $k_{h^* \to g}$ of energy transfer so that another competing rate constant $k_r + k_n (= 1/\tau)$ becomes relatively small.

(Energy Transfer Efficiency in (2-1))

The energy transfer process in (2-1) is considered. In the process in Formula (2-1), energy transfers by both Förster mechanism (Formula (1)) and Dexter mechanism (Formula (2)) are possible.

First, an energy transfer by Förster mechanism is considered. When $\tau$ is eliminated from Formula (1) and Formula (3), it can be said that the energy transfer efficiency $\Phi_{ET}$ is higher when the quantum yield $\phi$ (here, a fluorescent quantum yield because energy transfer from a singlet excited state is discussed) is higher. However, in practice, a more important factor is that the emission spectrum of the host molecule (here, a fluorescent spectrum because energy transfer from a singlet excited state is discussed) largely overlaps with the absorption spectrum of the guest molecule (absorption corresponding to the transition from the singlet ground state to the singlet excited state) (note that it is preferable that the molar absorption coefficient of the guest molecule be also high). This means that the fluorescent spectrum of the host material overlaps with the absorption band of the substance exhibiting TADF, i.e., the guest material, which is on the longest wavelength side.

Next, an energy transfer by Dexter mechanism is considered. According to Formula (2), in order to increase the rate constant $k_{h^* \to g}$, it is preferable that an emission spectrum of a host molecule (here, a fluorescent spectrum because energy transfer from a singlet excited state is discussed) largely overlap with an absorption spectrum of a guest molecule (absorption corresponding to transition from a singlet ground state to a singlet excited state).

The above description suggests that the energy transfer efficiency in (2-1) can be optimized by making the fluorescent spectrum of the host material overlap with the absorption band of the substance exhibiting TADF, i.e., the guest material, which is on the longest wavelength side.

(Energy Transfer Efficiency in (2-2))

The energy transfer process in (2-2) is considered. In the process in Formula (2-1), energy transfer by Dexter mechanism (Formula (2)) is possible. Energy transfer by Förster mechanism is forbidden in this case; therefore, a description thereof is omitted. In the energy transfer by Dexter mechanism, in order to increase the rate constant $k_{h^* \to g}$, it is preferable as described above that an emission spectrum of a host molecule (here, a phosphorescent spectrum because energy transfer from a triplet excited state is discussed) largely overlap with an absorption spectrum of a guest molecule (absorption corresponding to direct transition from a singlet ground state to a triplet excited state). Note that in this structure, the guest material is a fluorescent compound and the host material is also generally a fluorescent compound, and therefore, the spectra thereof are unlikely to be observed at room temperature. In such a case, a phosphorescent spectrum and an absorption spectrum estimated by molecular orbital calculation or the like can be used. In some cases, a phosphorescent spectrum may be observed at very low temperature (in a liquid nitrogen atmosphere or a liquid helium atmosphere).

Note that the host molecule is generally a fluorescent compound; thus, phosphorescence lifetime ($\tau$) is a millisecond or longer which is extremely long (i.e., $k_r + k_n$ is low). This is because the transition from the triplet excited state to the ground state (singlet) is a forbidden transition. Formula (3) shows that this is favorable to energy transfer efficiency $\Phi_{ET}$.

The above description also suggests that energy transfer from the host molecule to the guest molecule, i.e., the processes in Formulae (2-1) and (2-2), is generally likely to occur as long as the fluorescent spectrum of the host molecule overlaps with the absorption spectrum corresponding to the transition of the guest molecule from the singlet ground state to the singlet excited state, and the phosphorescent spectrum (estimated) of the host material overlaps with the absorption spectrum (estimated) corresponding to the direct transition of the guest material from the singlet ground state to the triplet excited state.

However, as for the substance exhibiting thermally activated delayed fluorescence (TADF material), especially a substance exhibiting thermally activated delayed fluorescence with high efficiency at relatively low temperature, the $S_1$ level and the $T_1$ level are close to each other. In other words, the absorption spectrum corresponding to the transition of the guest molecule from the singlet ground state to the singlet excited state is very close to the absorption spectrum (estimated) corresponding to the direct transition from the singlet ground state to the triplet excited state. Therefore, the host molecule should be designed so as to have its fluorescent spectrum and phosphorescent spectrum in similar positions.

However, in general, the $S_1$ level differs greatly from the $T_1$ level ($S_1$ level>$T_1$ level); therefore, the fluorescence emission wavelength also differs greatly from the phosphorescence emission wavelength (fluorescence emission wavelength<phosphorescence emission wavelength). For example, 4,4'-di(N-carbazolyl)biphenyl (abbreviation: CBP), which is commonly used as a host molecule in a light-emitting element including a phosphorescent compound, has a phosphorescent spectrum at around 500 nm and has a fluorescent spectrum at around 400 nm, which are largely different by about 100 nm. This example also shows that it is extremely difficult to design a host molecule so as to have its fluorescent spectrum in a position similar to that of its phosphorescent spectrum.

Therefore, one embodiment of the present invention provides a useful technique which can overcome a problem of the efficiency of the energy transfer from the host molecule in the triplet excited state to the guest molecule when the substance exhibiting thermally activated delayed fluorescence, especially a substance exhibiting thermally activated delayed fluorescence with high efficiency at relatively low temperature, is used as a light-emitting substance. Specific embodiments thereof will be described below.

This embodiment provides a light-emitting element in which an exciplex (an excited complex) is used as an energy donor capable of efficiently transferring energy to a substance exhibiting thermally activated delayed fluorescence. The exciplex is formed from two kinds of substances and is characterized in that its singlet and triplet excited states are close to each other. Thus, by making fluorescent light emission of the exciplex overlap with an absorption band on the longest wavelength side which corresponds to absorption by the substance exhibiting thermally activated delayed fluorescence, i.e., an energy acceptor, in a singlet excited state (an absorption corresponding to the transition from the singlet ground state to the singlet excited state), it becomes possible to improve the efficiency of energy transfer from the singlet excited state of the exciplex to the singlet excited state of the substance exhibiting thermally activated delayed fluorescence, and it also becomes possible to make a phosphorescent spectrum (estimated) of the exciplex in the triplet excited state overlap with an absorption (estimated) corresponding to the direct transition of the substance exhibiting thermally activated delayed fluorescence from the singlet ground state to a triplet excited state.

This makes it possible to improve the efficiency of energy transfer from the singlet excited state of the exciplex to the singlet excited state of the substance exhibiting thermally activated delayed fluorescence, and also makes it possible to improve the efficiency of energy transfer from a triplet excited state of the exciplex to the triplet excited state of the substance exhibiting thermally activated delayed fluorescence.

The positions of the $S_1$ level and the $T_1$ level normally differ from substance to substance. In the case where fluorescent substances are used as a host material and a guest material, even when a fluorescent spectrum of a host molecule overlaps with an absorption corresponding to the transition of a guest molecule from a singlet ground state to a singlet excited state, a phosphorescent spectrum (estimated) of the host molecule does not necessarily overlap with an absorption (estimated) corresponding to energy transfer of the guest molecule from the singlet ground state to a triplet excited state. Furthermore, in many cases, it is difficult or impossible to observe a phosphorescent spectrum of a fluorescent substance and an absorption corresponding to energy transfer of a fluorescent substance from a singlet ground state to a triplet excited state. Therefore, it is difficult to determine whether or not they overlap with each other.

Meanwhile, as described above, the $S_1$ level and the $T_1$ level of the substance exhibiting thermally activated delayed fluorescence are close to each other, and those of the exciplex are close to each other. Therefore, by making the absorption corresponding to the transition of the substance exhibiting thermally activated delayed fluorescence from the singlet ground state to the singlet excited state overlap with the fluorescent spectrum of the exciplex, it becomes possible to make the absorption (estimated) corresponding to the direct transition of the substance exhibiting thermally activated delayed fluorescence from the singlet ground state to the triplet excited state overlap with the phosphorescent spectrum (estimated) of the exciplex.

Figure 2:
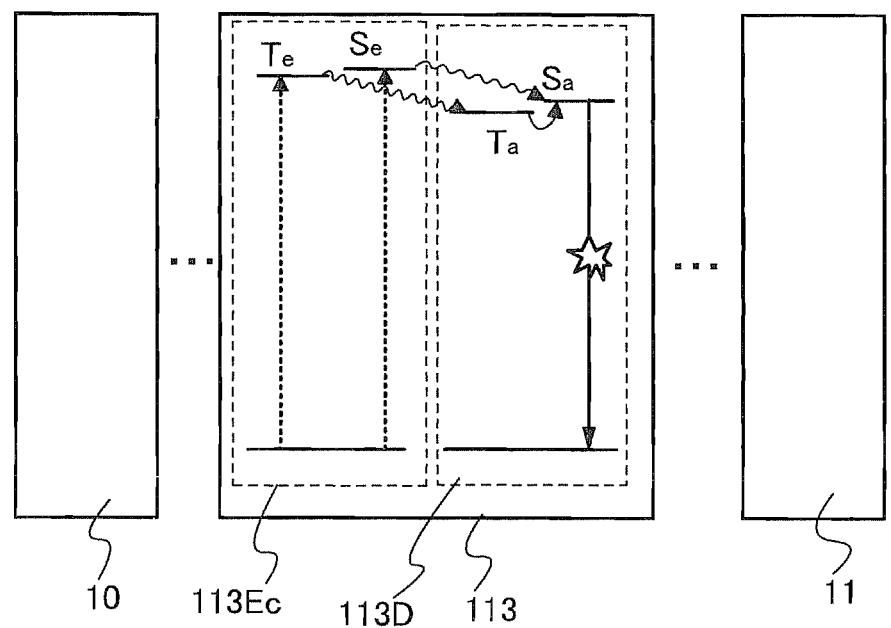
FIG. 2 illustrates energy transfer in a light-emitting layer.

In a light-emitting element having the above structure, energy transfer occurs efficiently as illustrated in FIG. 2. FIG. 2 shows that a light-emitting layer 113 is provided between an electrode 10 and an electrode 11. There may be a given layer between each electrode and the light-emitting layer 113. Energy transfer occurs from a singlet excited state Se of an exciplex 113Ec to a singlet excited state Sa of a light-emitting substance 113D, and energy transfer occurs from a triplet excited state Te of the exciplex 113Ec to a triplet excited state Ta of the light-emitting substance 113D. Then, the light-emitting substance 113D in the triplet excited state undergoes reverse intersystem crossing to its singlet excited state, and light emission occurs from the light-emitting substance 113D in the singlet excited state Sa. In the light-emitting element of this embodiment, each of these energy transfers occurs favorably; thus, the light-emitting element can have high emission efficiency.

Figure 1B:
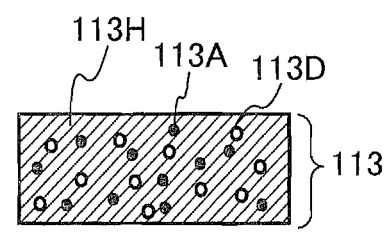

FIGS. 1A and 1B are schematic diagrams of the light-emitting element of this embodiment. FIG. 1A is a diagram of the light-emitting element, and FIG. 1B is an enlarged diagram of only a light-emitting layer.

The light-emitting element includes an EL layer 103 between a pair of electrodes, a first electrode 101 and a second electrode 102, and the EL layer 103 contains an organic compound as a light-emitting substance. In addition, the EL layer includes a light-emitting layer 113, and the light-emitting substance is contained at least in the light-emitting layer 113. There is no limitation on layers other than the light-emitting layer, and any layer may be used as the other layers. A typical stacked-layer structure includes a hole-injection layer 111, a hole-transport layer 112, the light-emitting layer 113, an electron-transport layer 114, an electron-injection layer 115, and the like. Besides, a carrier-blocking layer or the like may be provided, or a plurality of light-emitting layers may be provided.

The light-emitting layer 113 contains a first organic compound 113H, a second organic compound 113A, and a light-emitting substance 113D as illustrated in FIG. 1B. In the light-emitting element of this embodiment, two kinds of materials, the first organic compound 113H and the second organic compound 113A, form a host material. Note that this does not exclude the possibility that the light-emitting layer 113 in the light-emitting element of this embodiment contains another substance.

A combination of the first organic compound 113H and the second organic compound 113A forms an exciplex. The exciplex is in a state where the $S_1$ level and the $T_1$ level thereof are close to each other, and it is particularly preferable that the combination form an exciplex having an energy difference of 0 eV to 0.2 eV between the $S_1$ level and the $T_1$ level.

The light-emitting substance 113D exhibits thermally activated delayed fluorescence, and preferably exhibits thermally activated delayed fluorescence with high efficiency at relatively low temperature (for example, 100° C. or lower). Specifically, a substance having an energy difference of 0 eV to 0.2 eV between the $S_1$ level and the $T_1$ level is preferable. Here, the term "delayed fluorescence" refers to light emission exhibited by a certain substance which has the same spectrum as normal fluorescence and has an extremely long lifetime. The lifetime is $10^{-6}$ seconds or longer, preferably $10^{-3}$ seconds or longer.

Furthermore, the combination of the exciplex and the substance exhibiting thermally activated delayed fluorescence has the above-described relationship. That is, the combination makes a fluorescent light emission spectrum of the exciplex overlap with an absorption band of the substance exhibiting thermally activated delayed fluorescence which is on the longest wavelength side. Accordingly, energy is efficiently transferred from the singlet excited state of the exciplex to the singlet excited state of the substance exhibiting thermally activated delayed fluorescence.

In each of the exciplex and the substance exhibiting thermally activated delayed fluorescence, the $S_1$ level and the $T_1$ level are close to each other. Thus, the above-described efficient energy transfer between the singlet excited states can bring about an increase in efficiency of energy transfer between the triplet excited states.

Examples of the substance exhibiting thermally activated delayed fluorescence include a fullerene, a derivative thereof, an acridine derivative such as proflavine, and eosin.

Other examples of the substance exhibiting thermally activated delayed fluorescence include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)), which are shown in the following structural formulae.

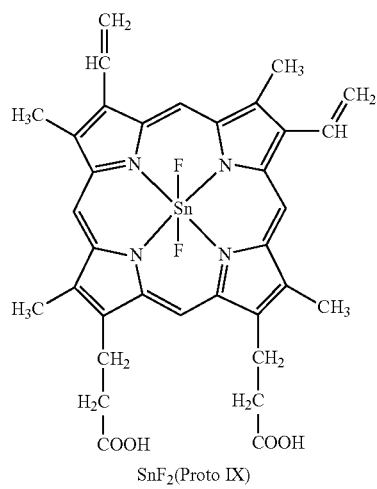

$SnF_2$(Proto IX)

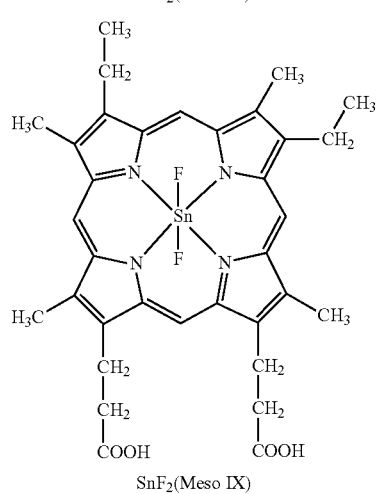

$SnF_2$(Meso IX)

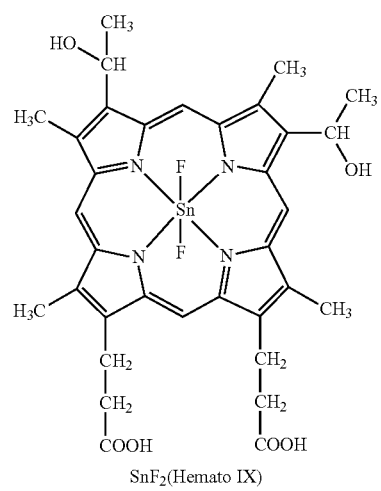

$SnF_2$(Hemato IX)

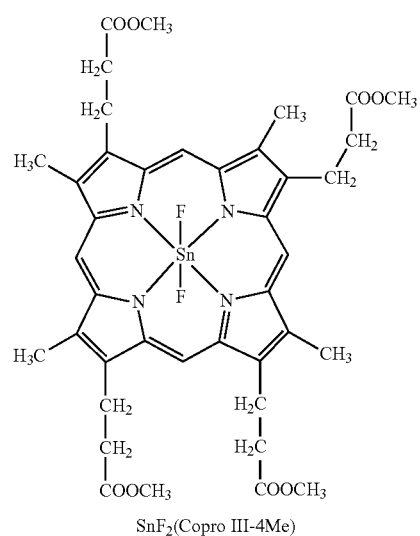

$SnF_2$(Copro III-4Me)

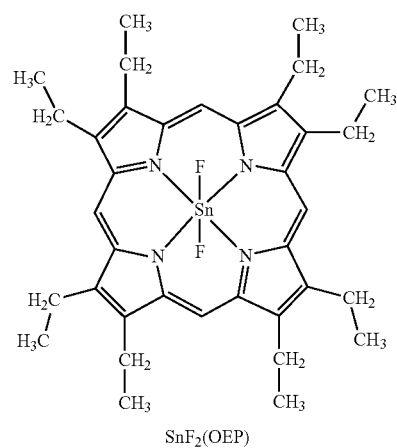

$SnF_2$(OEP)

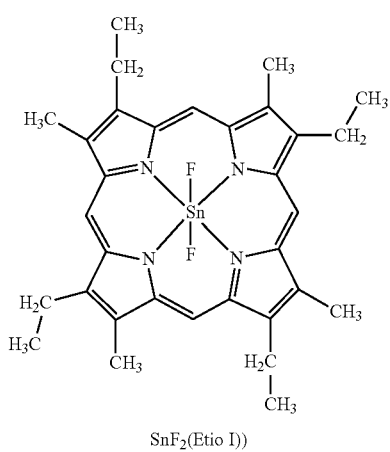

SnF₂(Etio I))

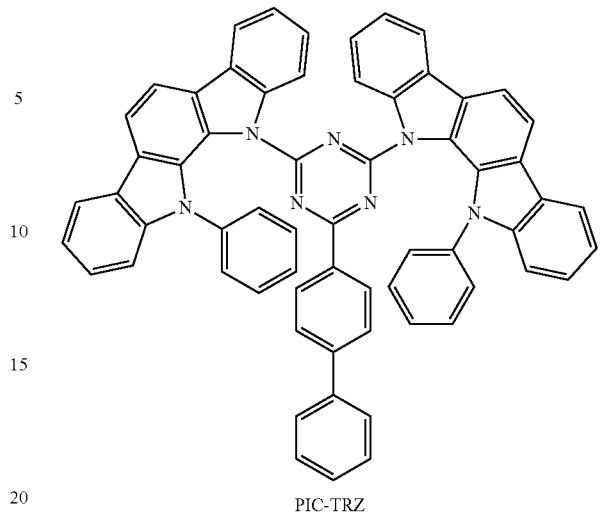

PIC-TRZ

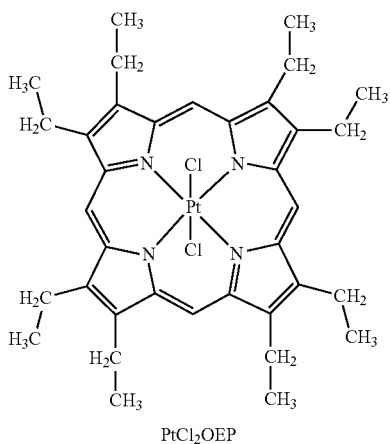

PtCl₂OEP

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ) shown in the following structural formula, can be used as the substance exhibiting thermally activated delayed fluorescence. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

As the combination of the first organic compound 113H and the second organic compound 113A, any combination can be used as long as it can form an exciplex, and known carrier-transport materials can be used. For efficient formation of an exciplex, a combination of a compound which easily accepts electrons (a compound having an electron-trapping property) and a compound which easily accepts holes (a compound having a hole-trapping property) is preferable as the combination of the first organic compound and the second organic compound.

As the compound which easily accepts electrons, a π-electron deficient heteroaromatic compound, a metal complex, or the like can be used. Specific examples include a metal complex such as bis(10-hydroxybenzo[h]quinolinato)beryllium (II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

As the compound which easily accepts holes, a π-electron rich heteroaromatic compound, an aromatic amine compound, or the like can be favorably used. Specific examples include a compound having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBAlBP), 4,4'-diphenyl-4"-(9-phenyl-9H-carbazol-3-yl)triphenylamine (abbreviation: PCBBilBP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(d ibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3 P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

The first organic compound and the second organic compound are not limited to these examples, as long as they can transport carriers, the combination can form an exciplex, and light emission of the exciplex overlaps with an absorption band on the longest wavelength side in an absorption spectrum of a light-emitting substance (an absorption corresponding to the transition of the light-emitting substance from the singlet ground state to the singlet excited state), and other known materials may be used.

Note that in the case where a compound which easily accepts electrons and a compound which easily accepts holes are used as the first organic compound and the second organic compound, carrier balance can be controlled by the mixture ratio of the compounds. Specifically, the ratio of the first organic compound to the second organic compound is preferably 1:9 to 9:1.

Here, compounds which foil an exciplex (the first organic compound 113H and the second organic compound 113A) and the exciplex will be described in a little more detail.

Figure 14A:
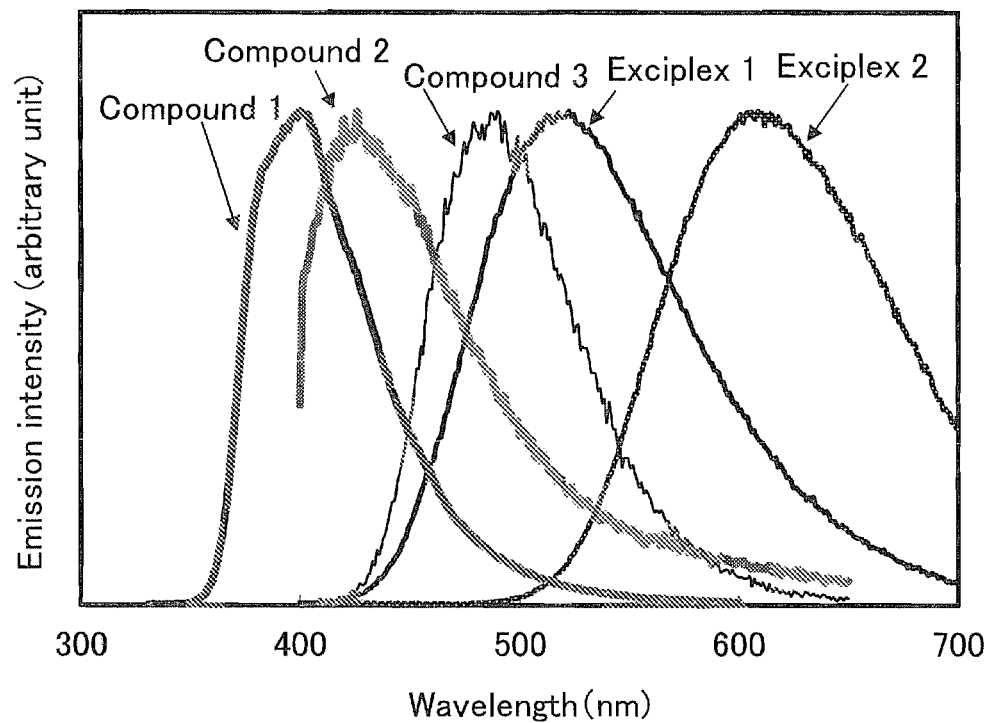
FIGS. 14A and 14B are diagrams illustrating emission wavelengths of exciplexes.
Figure 14B:
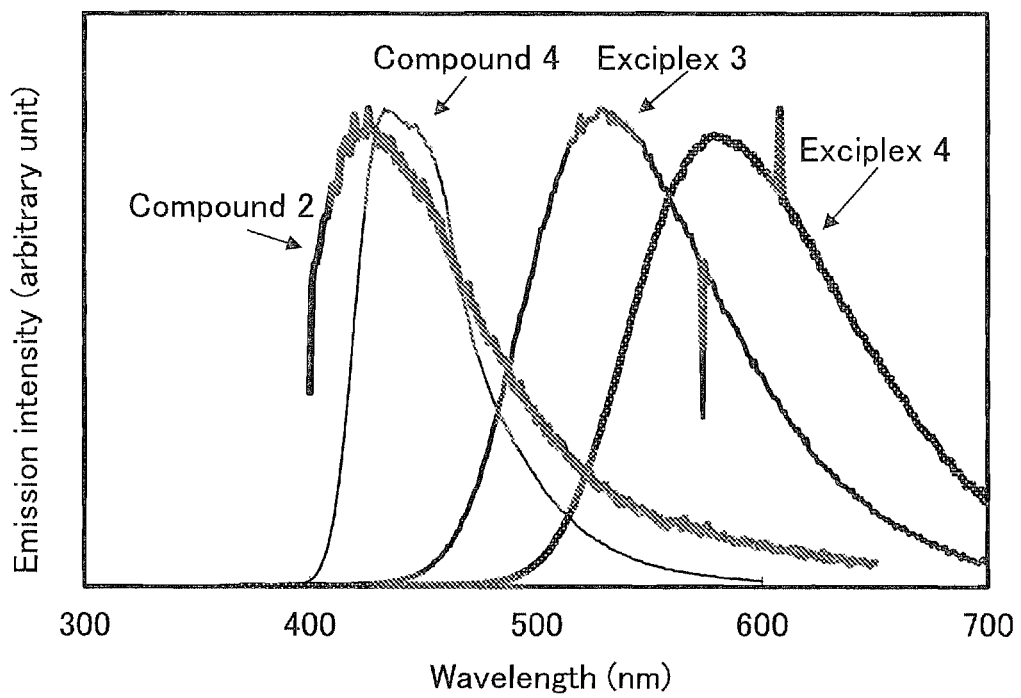

FIGS. 14A and 14B show emission spectra of individual substances and emission spectra of exciplexes. Note that in the figures, a compound 1 is 2-[4-(dibenzothiophen-4-yl)phenyl]-1-phenyl-1H-benzimidazole (abbreviation: DBTBIm-II); a compound 2 is 2-[3-(dibenzothiophen-4-yl)phenyl]dibenzo[f,h]quinoxaline (abbreviation: 2mDBTPDBq-II); a compound 3 is 4,4',4"-tris[N-(1-naphthyl)-N-phenylamino]triphenylamine (abbreviation: 1'-TNATA); a compound 4 is 2,7-bis[N-(4-diphenylaminophenyl)-N-phenylamino]-spiro-9,9'-bifluorene (abbreviation: DPA2SF); an exciplex 1 is an exciplex of the compound 1 and the compound 3; an exciplex 2 is an exciplex of the compound 2 and the compound 3; an exciplex 3 is an exciplex of the compound 2 and 4,4'-bis[N-(1-naphthyl)-N-phenylamino]biphenyl (abbreviation: NPB); and an exciplex 4 is an exciplex of the compound 2 and the compound 4.

Structural formulae of the compounds are shown below.

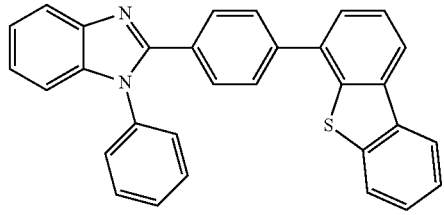

Compound 1

DBTBlm-II

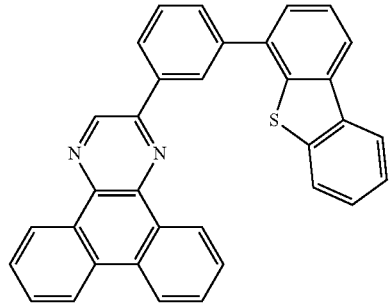

Compound 2

2mDBTPDBq-II

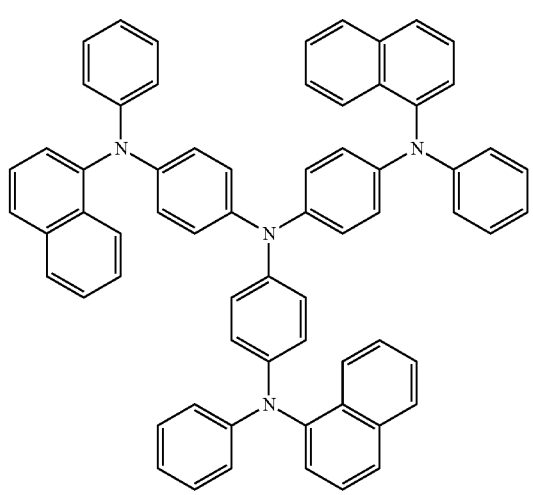

Compound 3

1'-TNATA

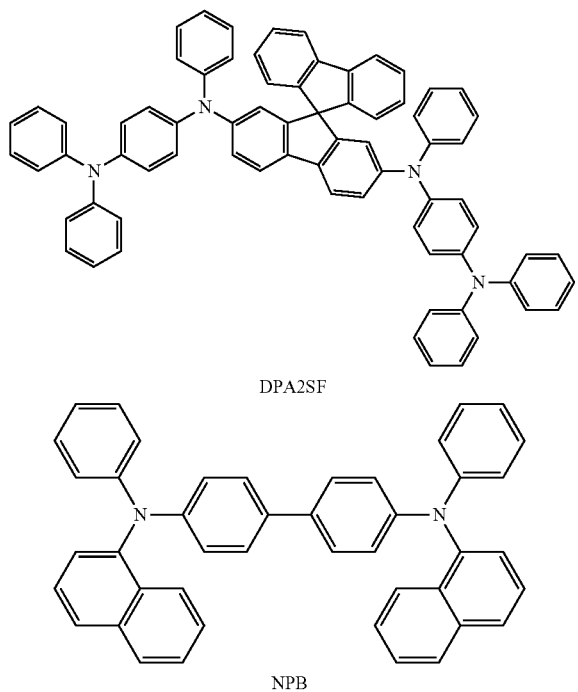

Compound 4

DPA2SF

NPB

FIG. 14A shows emission spectra of the exciplexes 1 and 2 and the compounds 1 to 3. The spectrum of the exciplex 1 is the result of measuring light emission of a material based on the compound 1 to which a slight amount of compound 3 is added, and the spectrum of the exciplex 2 is the result of measuring light emission of a material based on the compound 2 to which a slight amount of compound 3 is added. That is, in a sample used for measurement of the exciplex 1, one of the compounds 1 and 3 corresponds to the first organic compound 113H, and the other corresponds to the second organic compound 113A. In a sample used for measurement of the exciplex 2, one of the compounds 2 and 3 corresponds to the first organic compound 113H, and the other corresponds to the second organic compound 113A.

As can be seen from FIG. 14A, there is a difference of 100 nm or more between light emission of the exciplex 1 and light emission of the exciplex 2 even though both materials contain the compound 3 as a slight-amount component. This means that the emission wavelength of an exciplex can be easily adjusted by changing a base substance.

Note that the peak emission wavelength of the exciplex 1 is about 520 nm; thus, a host material containing the compound 1 and the compound 3 can be suitably used as a host material for materials exhibiting blue-green to orange thermally activated delayed fluorescence.

The peak emission wavelength of the exciplex 2 is about 610 nm; thus, a host material containing the compound 2 and the compound 3 can be suitably used as a host material for materials exhibiting red thermally activated delayed fluorescence.

FIG. 14B shows emission spectra of the exciplexes 3 and 4 and the compounds 2 and 4. The spectrum of the exciplex 3 is the result of measuring light emission of a material based on the compound 2 to which a slight amount of NPB is added, and the spectrum of the exciplex 4 is the result of measuring light emission of a material based on the compound 2 to which a slight amount of the compound 4 is added. That is, in a sample used for measurement of the exciplex 3, one of the compound 2 and NPB corresponds to the first organic compound 113H, and the other corresponds to the second organic compound 113A. In a sample used for measurement of the exciplex 4, one of the compounds 2 and 4 corresponds to the first organic compound 113H, and the other corresponds to the second organic compound 113A.

As can be seen from FIG. 14B, there is a difference of about 100 nm between light emission of the exciplex 3 and light emission of the exciplex 4 even though both materials contain the same base material. This means that the emission wavelength of an exciplex can be easily adjusted by changing a substance that is a slight-amount component.

Note that the peak emission wavelength of the exciplex 3 is about 520 nm; thus, a host material containing the compound 2 and NPB can be suitably used as a host material for materials exhibiting blue-green to orange thermally activated delayed fluorescence.

The peak emission wavelength of the exciplex 4 is about 580 nm; thus, a host material containing the compound 2 and the compound 4 can be suitably used as a host material for materials exhibiting orange to red thermally activated delayed fluorescence. Note that in order to achieve favorable energy transfer, it is preferable that the difference in equivalent energy value between a peak wavelength in an absorption band, on the lowest energy side, of the substance exhibiting thermally activated delayed fluorescence and a peak wavelength of light emission of the exciplex be 0.2 eV or less.

The light-emitting element having the above structure has high efficiency in energy transfer to the substance exhibiting thermally activated delayed fluorescence and has high emission efficiency.

Embodiment 2

In this embodiment, a detailed example of the structure of the light-emitting element described in Embodiment 1 will be described below with reference to FIGS. 1A and 1B.

A light-emitting element in this embodiment includes, between a pair of electrodes, an EL layer including a plurality of layers. In this embodiment, the light-emitting element includes the first electrode 101, the second electrode 102, and the EL layer 103 which is provided between the first electrode 101 and the second electrode 102. Note that the following description in this embodiment is made on the assumption that the first electrode 101 functions as an anode and that the second electrode 102 functions as a cathode. In other words, when a voltage is applied between the first electrode 101 and the second electrode 102 so that the potential of the first electrode 101 is higher than that of the second electrode 102, light emission can be obtained.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specifically, for example, indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like can be given. Films of these electrically conductive metal oxides are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer which is in contact with the first electrode 101 in the EL layer 103, an electrode material can be selected regardless of its work function.

There is no particular limitation on the stacked-layer structure of the EL layer 103 as long as the light-emitting layer 113 has the structure described in Embodiment 1. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which a hole-injection layer 111, a hole-transport layer 112, a light-emitting layer 113, an electron-transport layer 114, and an electron-injection layer 115 are stacked in this order over the first electrode 101. Specific examples of materials used for each layer are given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(ethylenedioxythiophene)/poly(styrenesulfonic acid) (abbreviation: PEDOT/PSS), or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can also be used for the first electrode 101. As the substance having an acceptor property, 7,7,8,8-tetracyano-2,3,5,6-tetrafluoroquinodimethane (abbreviation: $F_4$-TCNQ), chloranil, and the like can be given. In addition, transition metal oxides can be given. Oxides of the metals that belong to Groups 4 to 8 of the periodic table can be given. Specifically, vanadium oxide, niobium oxide, tantalum oxide, chromium oxide, molybdenum oxide, tungsten oxide, manganese oxide, and rhenium oxide are preferable in that their electron-accepting property is high. Among these oxides, molybdenum oxide is particularly preferable in that it is stable in the air, has a low hygroscopic property, and is easy to handle.

As the substance having a hole-transport property which is used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ $cm^2/Vs$ or more is preferably used. Organic compounds that can be used as the substance having a hole-transport property in the composite material are specifically given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. The aromatic hydrocarbon which has a hole mobility of $1\times10^{-6}$ $cm^2/Vs$ or more and which has 14 to 42 carbon atoms is particularly preferable.

Note that the aromatic hydrocarbons that can be used for the composite material may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

A polymeric compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine](abbreviation: poly-TPD) can also be used.

By providing a hole-injection layer, a high hole-injection property can be achieved to allow a light-emitting element to be driven at a low voltage.

The hole-transport layer 112 is a layer that contains a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ cm$^2$/Vs or more. An organic compound given as an example of the substance having a hole-transport property in the composite material described above can also be used for the hole-transport layer 112. A polymeric compound such as poly(N-vinylcarbazole) (abbreviation: PVK) or poly(4-vinyltriphenylamine) (abbreviation: PVTPA) can also be used. Note that the layer that contains a substance having a hole-transport property is not limited to a single layer, and may be a stack of two or more layers including any of the above substances.

The light-emitting layer 113 contains a light-emitting substance, a first organic compound, and a second organic compound. Since the light-emitting layer 113 has the structure described in Embodiment 1, the light-emitting element in this embodiment can have extremely high emission efficiency. Embodiment 1 is to be referred to for the components of the light-emitting layer 113.

The light-emitting layer 113 having the above-described structure can be formed by co-evaporation by a vacuum evaporation method, or an inkjet method, a spin coating method, a dip coating method, or the like using a mixed solution.

The electron-transport layer 114 is a layer containing a substance having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here have high electron-transport properties and are mainly ones that have an electron mobility of $10^{-6}$ cm$^2$/Vs or more. Note that any of the above-described host materials having electron-transport properties may be used for the electron-transport layer 114.

The electron-transport layer 114 is not limited to a single layer, and may be a stack of two or more layers containing any of the above substances.

Between the electron-transport layer and the light-emitting layer, a layer that controls transport of electron carriers may be provided. This is a layer formed by addition of a small amount of a substance having a high electron-trapping property to the aforementioned material having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, the electron-injection layer 115 may be provided in contact with the second electrode 102. For the electron-injection layer 115, an alkali metal, an alkaline earth metal, or a compound thereof, such as lithium fluoride (LiF), cesium fluoride (CsF), or calcium fluoride (CaF$_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the EL layer 103 regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference applied between the first electrode 101 and the second electrode 102, and holes and electrons recombine in the light-emitting layer 113 which contains a light-emitting substance, so that light is emitted. That is, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102.

In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the light-emitting substance of the light-emitting layer or the emission center substance included in the light-emitting layer.

The light-emitting element in this embodiment is provided over a substrate of glass, plastic, a metal, or the like. Note that as a substrate which transmits light from the light-emitting element, a substrate having a high visible light transmitting property is used. As the way of stacking layers over the substrate, layers may be sequentially stacked from the first electrode 101 side or sequentially stacked from the second electrode 102 side. In a light-emitting device, although one light-emitting element may be formed over one substrate, a plurality of light-emitting elements may be formed over one substrate. With a plurality of light-emitting elements as described above formed over one substrate, a lighting device in which elements are separated or a passive-matrix light-emitting device can be manufactured. A light-emitting element may be formed over an electrode electrically connected to a thin film transistor (TFT), for example, which is formed over a substrate of glass, plastic, or the like, so that an active matrix light-emitting device in which the TFT controls the drive of the light-emitting element can be manufactured. Note that there is no particular limitation on the structure of the TFT, which may be a staggered TFT or an inverted staggered TFT. In addition, crystallinity of a semiconductor used for the TFT is not particularly limited either; an amorphous semiconductor or a crystalline semiconductor may be used. In addition, a driver circuit formed in a TFT substrate may be formed with an n-type TFT and a p-type TFT, or with either an n-type TFT or a p-type TFT.

Note that this embodiment can be combined with any of the other embodiments as appropriate.

Embodiment 3

In this embodiment, a light-emitting device including the light-emitting element described in Embodiment 1 or 2 will be described.

In this embodiment, the light-emitting device manufactured using the light-emitting element described in Embodiment 1 or 2 is described with reference to FIGS. 3A and 3B. Note that FIG. 3A is a top view of the light-emitting device and FIG. 3B is a cross-sectional view taken along the lines A-B and C-D in FIG. 3A. This light-emitting device includes a driver circuit portion (source line driver circuit) 601, a pixel portion 602, and a driver circuit portion (gate line driver circuit) 603, which are to control light emission of a light-emitting element 618 and illustrated with dotted lines. Moreover, a reference numeral 604 denotes a sealing substrate; 625, a drying agent; 605, a sealing material; and 607, a space surrounded by the sealing material 605.

Reference numeral 608 denotes a wiring for transmitting signals to be input to the source line driver circuit 601 and the gate line driver circuit 603 and receiving signals such as a video signal, a clock signal, a start signal, and a reset signal from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

The driver circuit portion and the pixel portion are formed over an element substrate 610; FIG. 3B shows the source line driver circuit 601, which is a driver circuit portion, and one of the pixels in the pixel portion 602.

As the source line driver circuit 601, a CMOS circuit in which an n-channel TFT 623 and a p-channel TFT 624 are combined is formed. In addition, the driver circuit may be formed with any of a variety of circuits such as a CMOS circuit, a PMOS circuit, or an NMOS circuit. Although a driver integrated type in which the driver circuit is faulted over the substrate is illustrated in this embodiment, the driver circuit is not necessarily formed over the substrate, and the driver circuit can be formed outside, not over the substrate.

The pixel portion 602 includes a plurality of pixels including a switching TFT 611, a current controlling TFT 612, and a first electrode 613 electrically connected to a drain of the current controlling TFT 612. Note that to cover an end portion of the first electrode 613, an insulator 614 is formed, for which a positive photosensitive acrylic resin film is used here.

In order to improve coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

In addition, the EL layer 616 is formed by any of a variety of methods such as an evaporation method using an evaporation mask, an inkjet method, and a spin coating method. The EL layer 616 has the structure described in Embodiment 1 or 2. Further, for another material included in the EL layer 616, any of low molecular-weight compounds and polymeric compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element 618 is formed with the first electrode 613, the EL layer 616, and the second electrode 617. The light-emitting element has the structure described in Embodiment 2. In the light-emitting device of this embodiment, the pixel portion 602, which includes a plurality of light-emitting elements, may include both the light-emitting element described in Embodiment 1 or 2 and a light-emitting element having a different structure.

Further, the sealing substrate 604 is attached to the element substrate 610 with the sealing material 605, so that the light-emitting element 618 is provided in the space 607 surrounded by the element substrate 610, the sealing substrate 604, and the sealing material 605. The space 607 may be filled with filler, or may be filled with an inert gas (such as nitrogen or argon), or the sealing material 605. It is preferable that the sealing substrate be provided with a recessed portion and the drying agent 625 be provided in the recessed portion, in which case deterioration due to influence of moisture can be suppressed.

An epoxy-based resin or glass frit is preferably used for the sealing material 605. It is preferable that such a material do not transmit moisture or oxygen as much as possible. As the sealing substrate 604, a glass substrate, a quartz substrate, or a plastic substrate fanned of fiberglass reinforced plastic (FRP), poly(vinyl fluoride) (PVF), polyester, acrylic, or the like can be used.

As described above, the light-emitting device which uses the light-emitting element described in Embodiment 1 or 2 can be obtained.

The light-emitting device in this embodiment is fabricated using the light-emitting element described in Embodiment 1 or 2 and thus can have favorable characteristics. Specifically, since the light-emitting element described in Embodiment 1 or 2 has high emission efficiency, the light-emitting device can have reduced power consumption. In addition, since the light-emitting element can be driven at low voltage, the light-emitting device can be driven at low voltage.

Figure 4A:
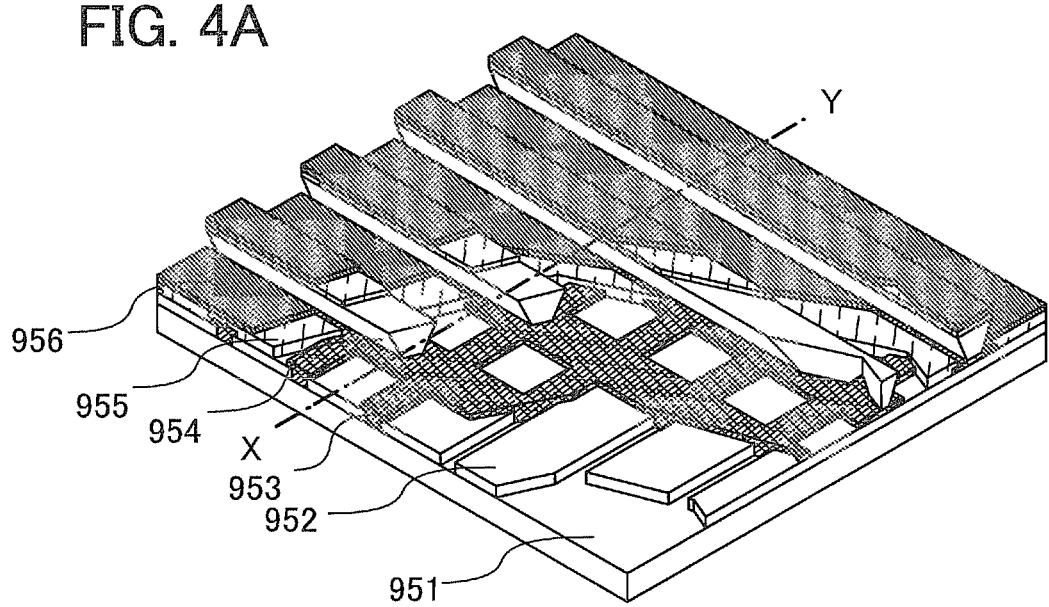
FIGS. 4A and 4B are schematic diagrams of a passive matrix light-emitting device.
Figure 4B:
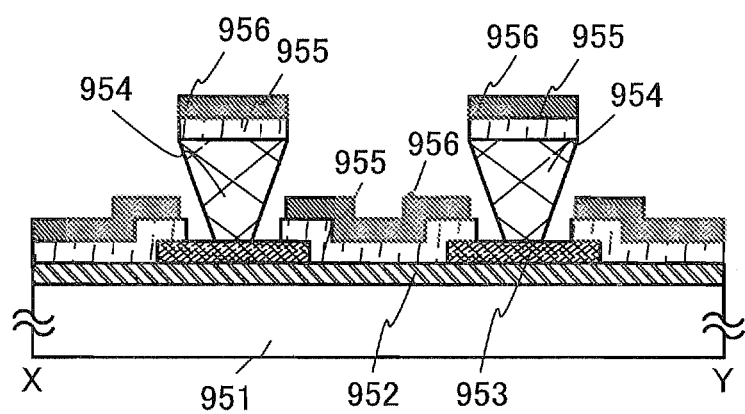

Although an active matrix light-emitting device is described above in this embodiment, application to a passive matrix light-emitting device may be carried out. FIGS. 4A and 4B illustrate a passive matrix light-emitting device manufactured using the present invention. FIG. 4A is a perspective view of the light-emitting device, and FIG. 4B is a cross-sectional view taken along the line X-Y in FIG. 4A. In FIGS. 4A and 4B, over a substrate 951, an EL layer 955 is provided between an electrode 952 and an electrode 956. An end portion of the electrode 952 is covered with an insulating layer 953. In addition, a partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side which is in contact with the insulating layer 953) is shorter than the upper side (a side which is not in contact with the insulating layer 953). The partition layer 954 thus provided can prevent defects in the light-emitting element due to cross-talk or the like. The passive matrix light-emitting device can also be driven with low power consumption by including the light-emitting element in Embodiment 1 or 2 which can be driven at low voltage. The passive matrix light-emitting device can be driven with low power consumption by including the light-emitting element in Embodiment 1 or 2.

Further, for performing full color display, a coloring layer or a color conversion layer may be provided in a light path through which light from the light-emitting element passes to the outside of the light-emitting device. An example of a light-emitting device in which full color display is achieved with the use of a coloring layer and the like is illustrated in FIGS. 5A and 5B. In FIG. 5A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 10246 and 1024B of light-emitting elements, a partition 1025, an EL layer 1028, a second electrode 1029 of the light-emitting elements, a sealing substrate 1031, a sealant 1032, and the like are illustrated. Further, coloring layers (a red coloring layer 1034R, a green coloring layer 1034G, and a blue coloring layer 1034B) are provided on a transparent base material 1033. Further, a black layer (a black matrix) 1035 may be additionally provided. The transparent base material 1033 provided with the coloring layers and the black layer is fixed to the substrate 1001. Note that the coloring layers and the black layer are covered with an overcoat layer 1036. In this embodiment, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, a full color image can be displayed using pixels of the four colors.

Figure 6:
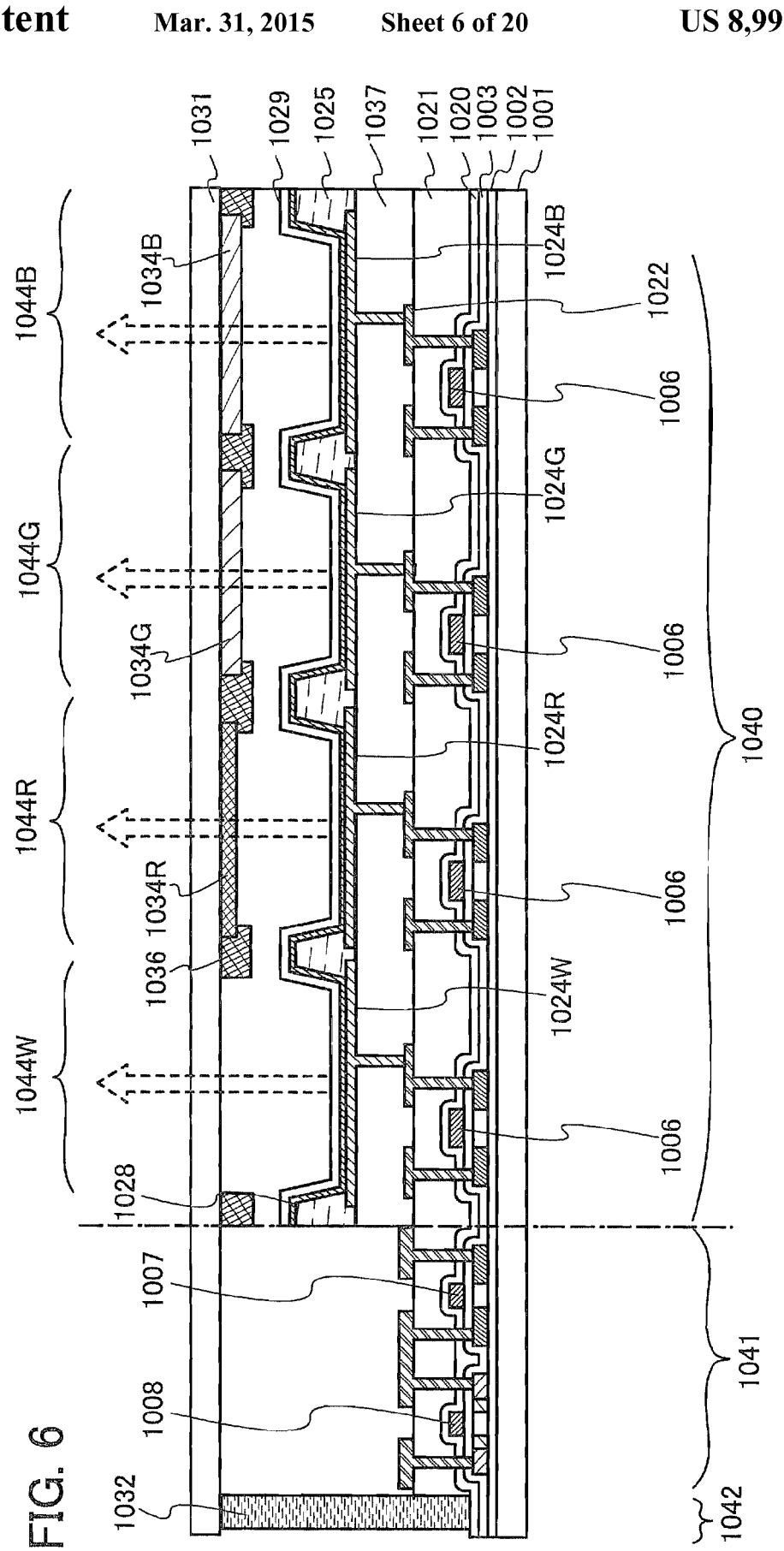
FIG. 6 is a schematic diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 6 is a cross-sectional view of a light-emitting device having a top emission structure. In this case, a substrate which does not transmit light can be used as the substrate 1001. Apart from the structure illustrated in FIG. 5A, a third interlayer insulating film 1037 is formed to cover an electrode 1022. This insulating film may have a planarization function.

The first electrodes 1024W, 1024R, 1024G, and 1024B of the light-emitting elements each serve as an anode here, but may serve as a cathode. The first electrodes are reflective electrodes. The EL layer 1028 is formed to have the structure described in Embodiment 1 or 2, with which white light emission can be obtained.

The coloring layers are each provided in a light path through which light from the light-emitting element passes to the outside of the light-emitting device. In the case of the light-emitting device having a bottom emission structure as illustrated in FIG. 5A, the coloring layers 1034R, 1034G, and 1034B can be provided on the transparent base material 1033 and then fixed to the substrate 1001. The coloring layers may be provided between the gate insulating film 1003 and the first interlayer insulating film 1020 as illustrated in FIG. 5B. In the case of a top emission structure as illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with a black layer 1036 which is positioned between pixels. The coloring layers (the red coloring layer 10348, the green coloring layer 1034G, and the blue coloring layer 1034B) and the black layer 1036 may be covered with an overcoat layer. Note that a light-transmitting substrate is used as the sealing substrate 1031.

When voltage is applied between the pair of electrodes of the thus obtained organic light-emitting element, a white light-emitting region 1044W can be obtained. In addition, by using the coloring layers, a red light-emitting region 1044R, a blue light-emitting region 1044B, and a green light-emitting region 1044G can be obtained. The light-emitting device in this embodiment includes the light-emitting element described in Embodiment 1 or 2; thus, a light-emitting device with low power consumption can be obtained.

Further, although an example in which full color display is performed using four colors of red, green, blue, and white is shown here, there is no particular limitation and full color display using three colors of red, green, and blue may be performed.

This embodiment can be freely combined with any of other embodiments.

Embodiment 4

Figure 7A:
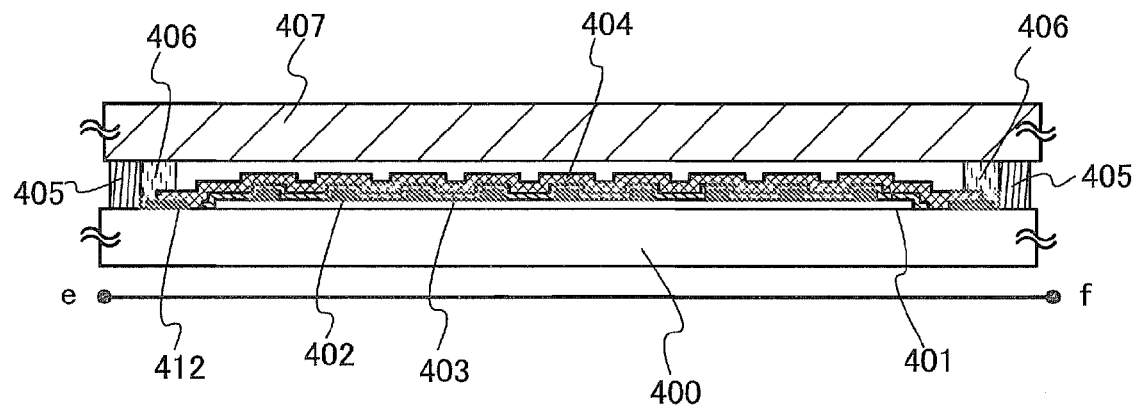
FIGS. 7A and 7B are schematic diagrams of a lighting device.
Figure 7B:
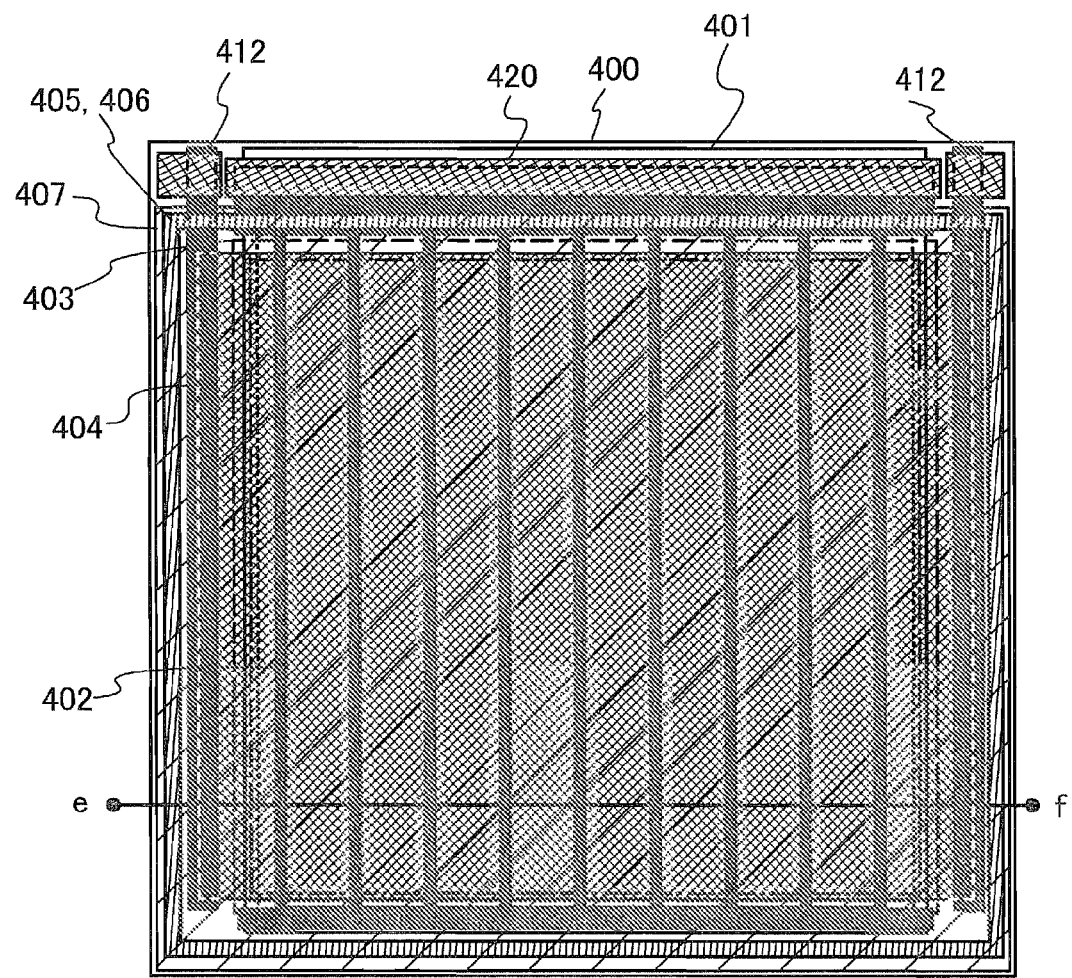

In this embodiment, an example in which the light-emitting element described in Embodiment 1 or 2 is used for a lighting device will be described with reference to FIGS. 7A and 7B. FIG. 7B is a top view of the lighting device, and FIG. 7A is a cross-sectional view taken along the line e-f in FIG. 7B.

In the lighting device in this embodiment, a first electrode 401 is formed over a substrate 400 which is a support and has a light-transmitting property. The first electrode 401 corresponds to the first electrode 101 in Embodiment 1 or 2.

An auxiliary electrode 402 is provided over the first electrode 401. Since light emission is extracted through the first electrode 401 side in the example given in this embodiment, the first electrode 401 is formed using a material having a light-transmitting property. The auxiliary electrode 402 is provided in order to compensate for the low conductivity of the material having a light-transmitting property, and has a function of suppressing luminance unevenness in a light emission surface due to voltage drop caused by the high resistance of the first electrode 401. The auxiliary electrode 402 is formed using a material having at least higher conductivity than the material of the first electrode 401, and is preferably formed using a material having high conductivity such as aluminum. Note that surfaces of the auxiliary electrode 402 other than a portion thereof in contact with the first electrode 401 are preferably covered with an insulating layer. This is for suppressing light emission over the upper portion of the auxiliary electrode 402, which cannot be extracted, for reducing a reactive current, and for suppressing a reduction in power efficiency. Note that a pad 412 for applying a voltage to a second electrode 404 may be formed at the same time as the formation of the auxiliary electrode 402.

An EL layer 403 is formed over the first electrode 401 and the auxiliary electrode 402. The EL layer 403 has the structure described in Embodiment 1 or 2. Refer to the descriptions for the structure. Note that the EL layer 403 is preferably formed to be slightly larger than the first electrode 401 when seen from above, in which case the EL layer 403 can also serve as an insulating layer that suppresses a short circuit between the first electrode 401 and the second electrode 404.

The second electrode 404 is formed to cover the EL layer 403. The second electrode 404 corresponds to the second electrode 102 in Embodiment 1 or 2 and has a similar structure. In this embodiment, it is preferable that the second electrode 404 be formed using a material having high reflectance because light emission is extracted through the first electrode 401 side. In this embodiment, the second electrode 404 is connected to the pad 412, whereby voltage is applied.

As described above, the lighting device described in this embodiment includes a light-emitting element including the first electrode 401, the EL layer 403, and the second electrode 404 (and the auxiliary electrode 402). Since the light-emitting element is a light-emitting element with high emission efficiency, the lighting device in this embodiment can be a lighting device having low power consumption. Furthermore, since the light-emitting element is a light-emitting element having high reliability, the lighting device in this embodiment can be a lighting device having high reliability.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 can be mixed with a desiccant which enables moisture to be adsorbed, increasing reliability.

When parts of the pad 412, the first electrode 401, and the auxiliary electrode 402 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in Embodiment 1 or 2 as an EL element, the lighting device can be a lighting device having low power consumption. Further, the lighting device can be a lighting device which can be driven at low voltage. Furthermore, the lighting device can be a lighting device having high reliability.

Embodiment 5

In this embodiment, examples of electronic devices each including the light-emitting element described in Embodiment 1 or 2 will be described. The light-emitting element described in Embodiment 1 or 2 has high emission efficiency and reduced power consumption. As a result, the electronic devices described in this embodiment can each include a light-emitting portion having reduced power consumption. In addition, the electronic devices can be driven at low voltage since the light-emitting element described in Embodiment 1 or 2 can be driven at low voltage.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

FIG. 8A illustrates an example of a television device. In the television device, a display portion 7103 is incorporated in a housing 7101. In addition, here, the housing 7101 is supported by a stand 7105. Images can be displayed on the display portion 7103, and in the display portion 7103, the light-emitting elements described in Embodiment 1 or 2 are arranged in a matrix. The light-emitting element can have high emission efficiency. Further, the light-emitting elements can be driven at low voltage. Furthermore, the light-emitting element can have a long lifetime. Therefore, the television device including the display portion 7103 which is formed using the light-emitting element can exhibit reduced power consumption. Further, the television device can be driven at low voltage. Furthermore, the television device can have high reliability.

Operation of the television device can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 8B1 illustrates a computer, which includes a main body 7201, a housing 7202, a display portion 7203, a keyboard 7204, an external connection port 7205, a pointing device 7206, and the like. Note that this computer is manufactured by arranging the light-emitting elements described in Embodiment 1 or 2 in a matrix in the display portion 7203. The computer illustrated in FIG. 8B1 may have a structure illustrated in FIG. 8B2. The computer illustrated in FIG. 8B2 is provided with a second display portion 7210 instead of the keyboard 7204 and the pointing device 7206. The second display portion 7210 has a touch screen, and input can be performed by operation of images, which are displayed on the second display portion 7210, with a finger or a dedicated pen. The second display portion 7210 can also display images other than the display for input. The display portion 7203 may also have a touch screen. Connecting the two screens with a hinge can prevent troubles; for example, the screens can be prevented from being cracked or broken while the computer is being stored or carried. The light-emitting elements can have high emission efficiency. Therefore, this computer having the display portion 7203 which is formed using the light-emitting elements can have reduced power consumption.

FIG. 8C illustrates a portable game machine having two housings, a housing 7301 and a housing 7302, which are connected with a joint portion 7303 so that the portable game machine can be opened or folded. The housing 7301 incorporates a display portion 7304 including the light-emitting elements described in Embodiment 1 or 2 and arranged in a matrix, and the housing 7302 incorporates a display portion 7305. In addition, the portable game machine illustrated in FIG. 8C includes a speaker portion 7306, a recording medium insertion portion 7307, an LED lamp 7308, input means (an operation key 7309, a connection terminal 7310, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion which includes the light-emitting elements described in Embodiment 1 or 2 and arranged in a matrix is used as either the display portion 7304 or the display portion 7305, or both, and the structure can include other accessories as appropriate. The portable game machine illustrated in FIG. 8C has a function of reading out a program or data stored in a storage medium to display it on the display portion, and a function of sharing information with another portable game machine by wireless communication. Note that functions of the portable game machine illustrated in FIG. 8C are not limited to them, and the portable game machine can have various functions. Since the light-emitting elements used in the display portion 7304 have high emission efficiency, the portable game machine including the above-described display portion 7304 can have reduced power consumption. Since each of the light-emitting elements used in the display portion 7304 can be driven at low voltage, the portable game machine can also be driven at low voltage. Furthermore, since the light-emitting elements used in the display portion 7304 each have a long lifetime, the portable game machine can have high reliability.

FIG. 8D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting elements described in Embodiment 1 or 2 and arranged in a matrix. The light-emitting elements can have high emission efficiency. Further, the light-emitting elements can be driven at low voltage. Furthermore, the light-emitting elements can have a long lifetime. Therefore, the mobile phone including the display portion 7402 which is formed using the light-emitting elements can have reduced power consumption. Further, the mobile phone can be driven at low voltage. Furthermore, the mobile phone can have high reliability.

When the display portion 7402 of the mobile phone illustrated in FIG. 8D is touched with a finger or the like, data can be input into the mobile phone. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode is selected for the display portion 7402 so that characters can be input on a screen. In this case, it is preferable to display a keyboard or number buttons on the screen of the display portion 7402.

When a sensing device including a sensor such as a gyroscope or an acceleration sensor for detecting inclination is provided inside the mobile phone, display on the screen can be automatically changed in direction by determining the orientation of the mobile phone (whether the mobile phone is placed horizontally or vertically).

The screen modes are switched by touch on the display portion 7402 or operation with the operation buttons 7403. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period, the screen mode may be controlled so as to be switched from the input mode to the display mode. Note that the touching operation may be sensed by an optical sensor in the display portion 7402.

The display portion 7402 may function as an image sensor. For example, an image of a palm print, a fingerprint, or the like is taken by the display portion 7402 while in touch with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device having the light-emitting element described in Embodiment 1 or 2 is wide so that this light-emitting device can be applied to electronic devices in a variety of fields. By using the light-emitting element described in Embodiment 1 or 2, an electronic device having reduced power consumption can be obtained.

Figure 9:
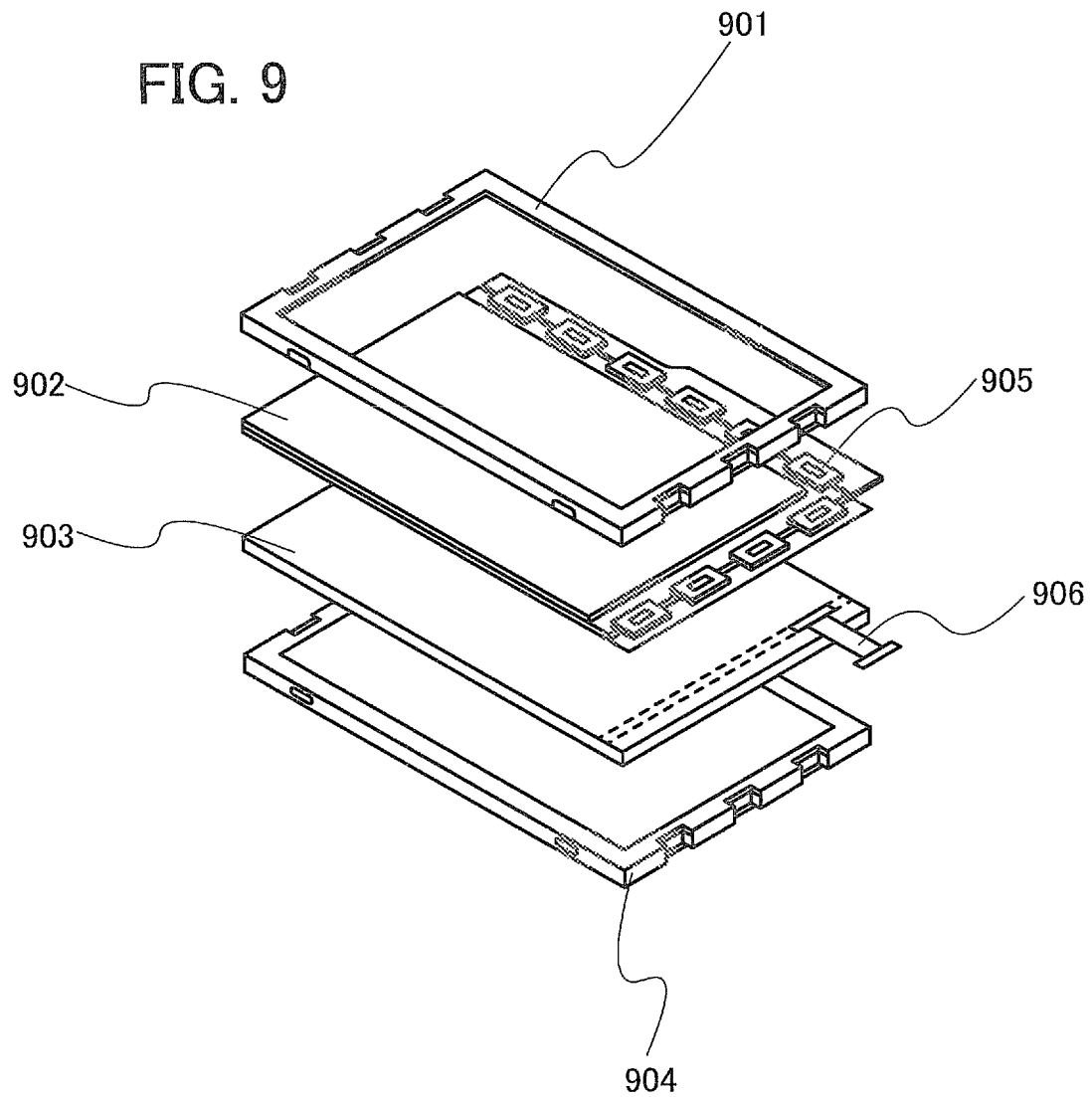
FIG. 9 illustrates an electronic device.

FIG. 9 illustrates an example of a liquid crystal display device using the light-emitting element described in Embodiment 1 or 2 for a backlight. The liquid crystal display device illustrated in FIG. 9 includes a housing 901, a liquid crystal layer 902, a backlight unit 903, and a housing 904. The liquid crystal layer 902 is connected to a driver IC 905. To the backlight unit 903 is supplied current through a terminal 906.

The light-emitting element described in Embodiment 1 or 2 is used for the backlight of the liquid crystal display device; thus, the backlight can have reduced power consumption. In addition, the use of the light-emitting element enables manufacture of a planar-emission lighting device and further a larger-area planar-emission lighting device; therefore, the backlight can be a larger-area backlight, and the liquid crystal display device can also be a larger-area device. Furthermore, the light-emitting device can be thinner than a conventional one; accordingly, the display device can also be thinner.

Figure 10:
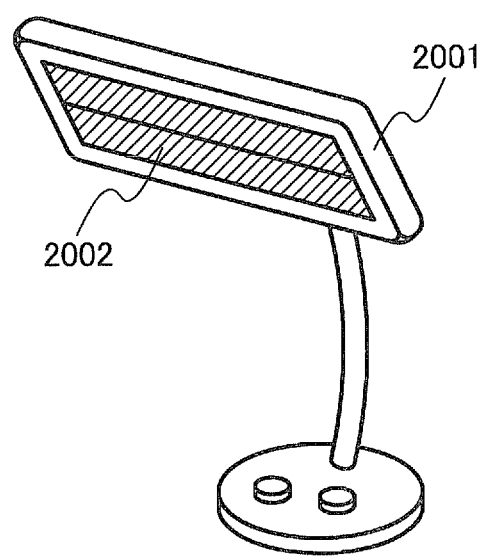
FIG. 10 illustrates a lighting device.

FIG. 10 illustrates an example in which the light-emitting element described in Embodiment 1 or 2 is used for a table lamp which is a lighting device. The table lamp illustrated in FIG. 10 includes a housing 2001 and a light source 2002, and the light-emitting device described in Embodiment 4 is used for the light source 2002.

Figure 11:
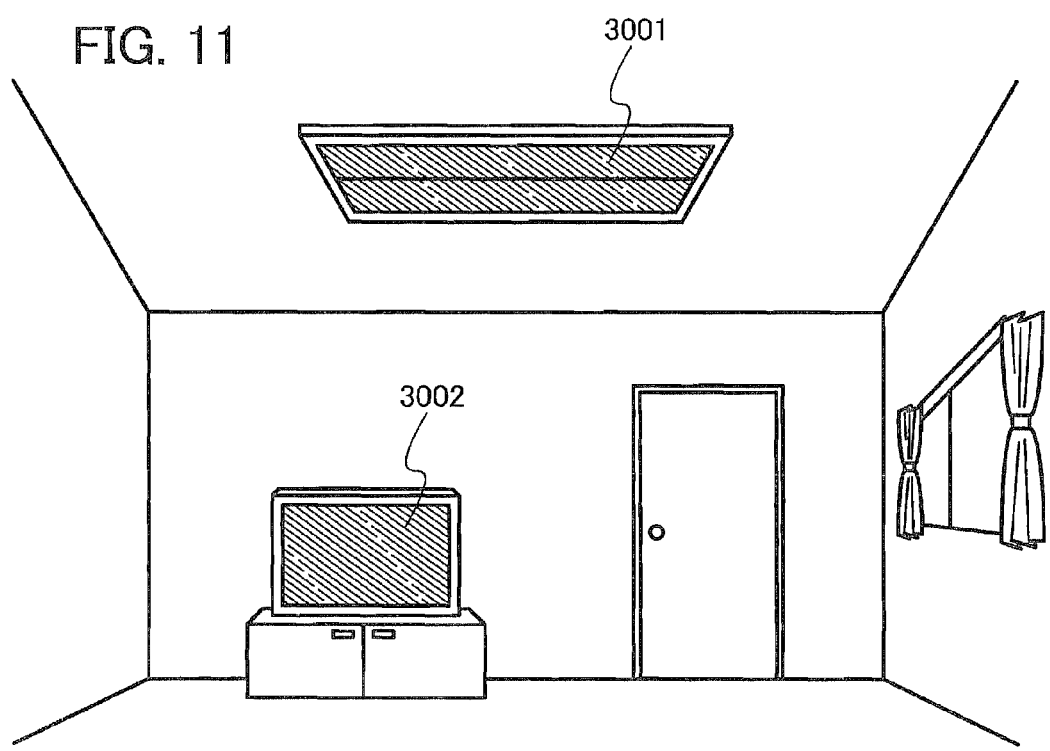
FIG. 11 illustrates a lighting device.

FIG. 11 illustrates an example in which the light-emitting element described in Embodiment 1 or 2 is used for an indoor lighting device 3001 and a display device 3002. Since the light-emitting element described in Embodiment 1 or 2 has reduced power consumption, a lighting device that has reduced power consumption can be obtained. Further, since the light-emitting element described in Embodiment 1 or 2 can have a large area, the light-emitting element can be used for a large-area lighting device. Furthermore, since the light-emitting element described in Embodiment 1 or 2 is thin, the light-emitting element can be used for a lighting device having a reduced thickness.

The light-emitting element described in Embodiment 1 or 2 can also be used for an automobile windshield or an automobile dashboard. FIG. 12 illustrates one mode in which the light-emitting elements described in Embodiment 1 or 2 are used for an automobile windshield and an automobile dashboard. Displays 5000 to 5005 each include the light-emitting element described in Embodiment 1 or 2.

The display 5000 and the display 5001 are provided in the automobile windshield in which the light-emitting elements described in Embodiment 1 or 2 are incorporated. The light-emitting element described in Embodiment 1 or 2 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

The display 5002 is provided in a pillar portion in which the light-emitting elements described in Embodiment 1 or 2 are incorporated. The display 5002 can compensate for the view hindered by the pillar portion by showing an image taken by an imaging unit provided in the car body. Similarly, the display 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display 5004 and the display 5005 can provide a variety of kinds of information such as navigation data, speed, axial rotation speed of an engine, a mileage, a fuel level, a gearshift state, and air-condition setting. The content or layout of the display can be changed freely by a user as appropriate. Note that such information can also be shown by the displays 5000 to 5003. The displays 5000 to 5005 can also be used as lighting devices.

The light-emitting element described in Embodiment 1 or 2 can have high emission efficiency and low power consumption. Therefore, load on a battery is small even when a number of large screens such as the displays 5000 to 5005 are provided, which provides comfortable use. For that reason, the light-emitting device and the lighting device each of which includes the light-emitting element described in Embodiment 1 or 2 can be suitably used as an in-vehicle light-emitting device and an in-vehicle lighting device.

Figure 13A:
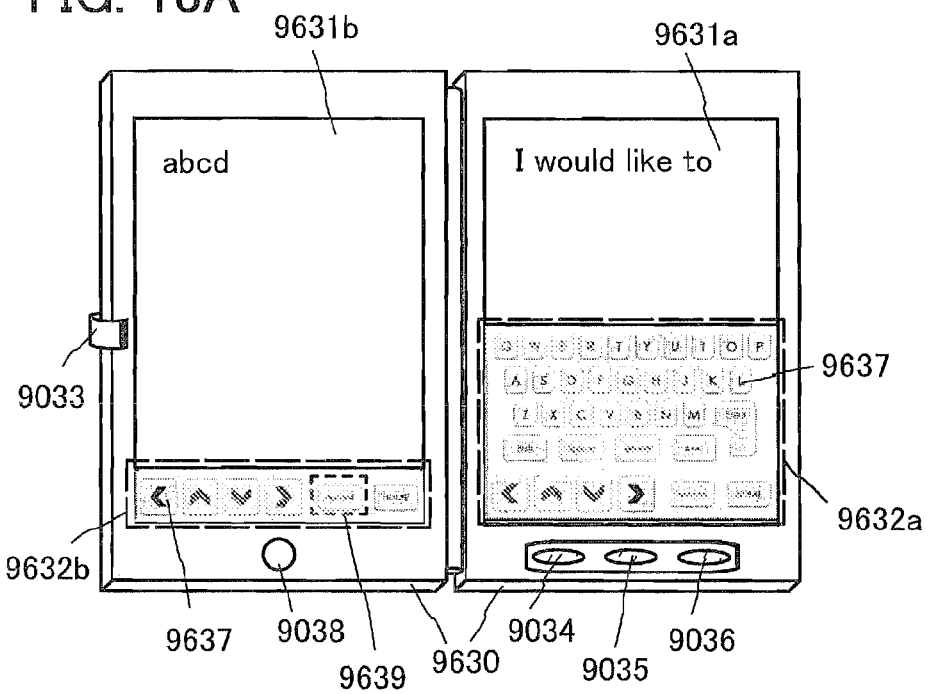
FIGS. 13A to 13C illustrate an electronic device.
Figure 13B:
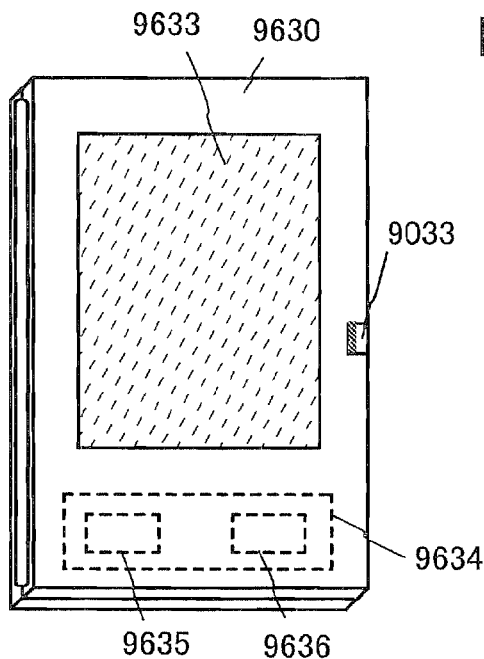

FIGS. 13A and 13B illustrate an example of a foldable tablet terminal. FIG. 13A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038. Note that in the tablet terminal, one or both of the display portion 9631a and the display portion 9631b is/are formed using a light-emitting device which includes the light-emitting element described in Embodiment 1 or 2.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving mode switch 9036 can control display luminance in accordance with the amount of external light in use of the tablet terminal sensed by an optical sensor incorporated in the tablet terminal. Another sensing device including a sensor such as a gyroscope or an acceleration sensor for detecting inclination may be incorporated in the tablet terminal, in addition to the optical sensor.

Although FIG. 13A illustrates an example in which the display portion 9631a and the display portion 9631b have the same display area, one embodiment of the present invention is not limited to the example. The display portion 9631a and the display portion 9631b may have different display areas and different display quality. For example, higher definition images may be displayed on one of the display portions 9631a and 9631b.

FIG. 13B illustrates the tablet terminal which is folded. The tablet terminal in this embodiment includes the housing 9630, a solar cell 9633, a charge and discharge control circuit 9634, a battery 9635, and a DC-to-DC converter 9636.

Since the tablet terminal is foldable, the housing 9630 can be closed when the tablet terminal is not in use. As a result, the display portion 9631a and the display portion 9631b can be protected, thereby providing a tablet terminal with high endurance and high reliability for long-term use.

The tablet terminal illustrated in FIGS. 13A and 13B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 can be provided on one or both surfaces of the housing 9630, so that the battery 9635 can be charged efficiently.

Figure 13C:
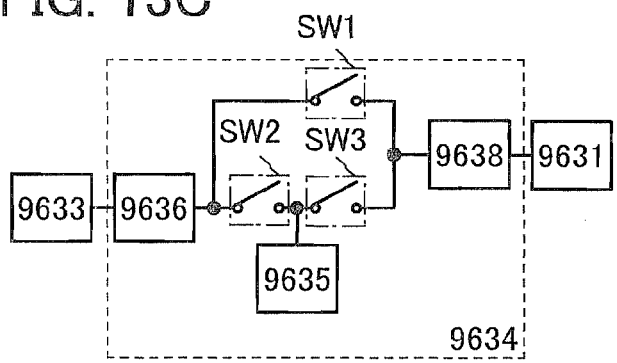

The structure and operation of the charge and discharge control circuit 9634 illustrated in FIG. 13B will be described with reference to a block diagram of FIG. 13C. FIG. 13C illustrates the solar cell 9633, the battery 9635, the DC-to-DC converter 9636, a converter 9638, switches SW1 to SW3, and a display portion 9631. The battery 9635, the DC-to-DC converter 9636, the converter 9638, and the switches SW1 to SW3 correspond to the charge and discharge control circuit 9634 illustrated in FIG. 13B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 13A to 13C as long as the display portion 9631 is included.

Example 1

In this example, a light-emitting element corresponding to one embodiment of the present invention is described, in which platinum(II) octaethylporphyrin (abbreviation: PtOEP) is used as a substance exhibiting thermally activated delayed fluorescence. Substances used in this example are shown below.

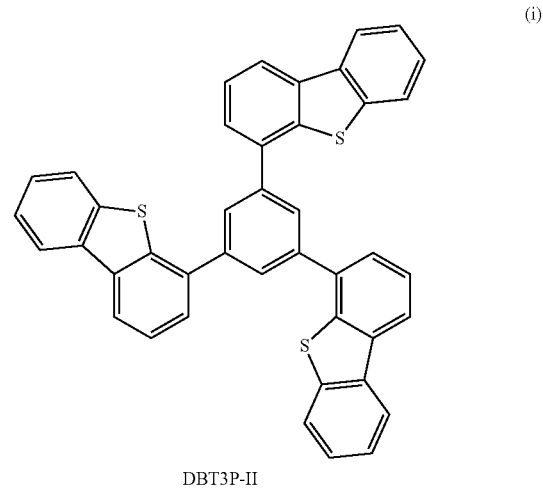

DBT3P-II

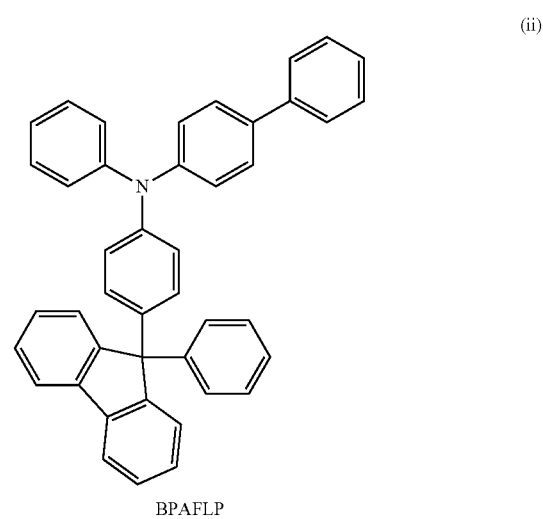

BPAFLP

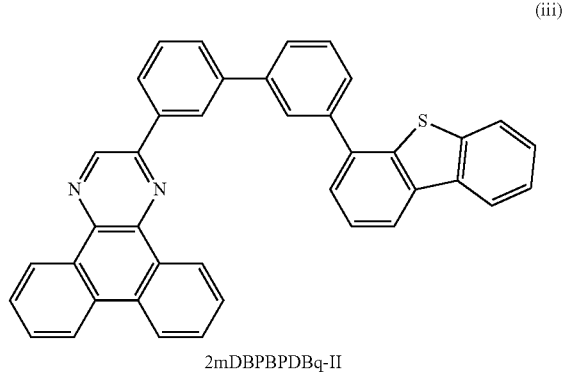

2mDBPBPDBq-II

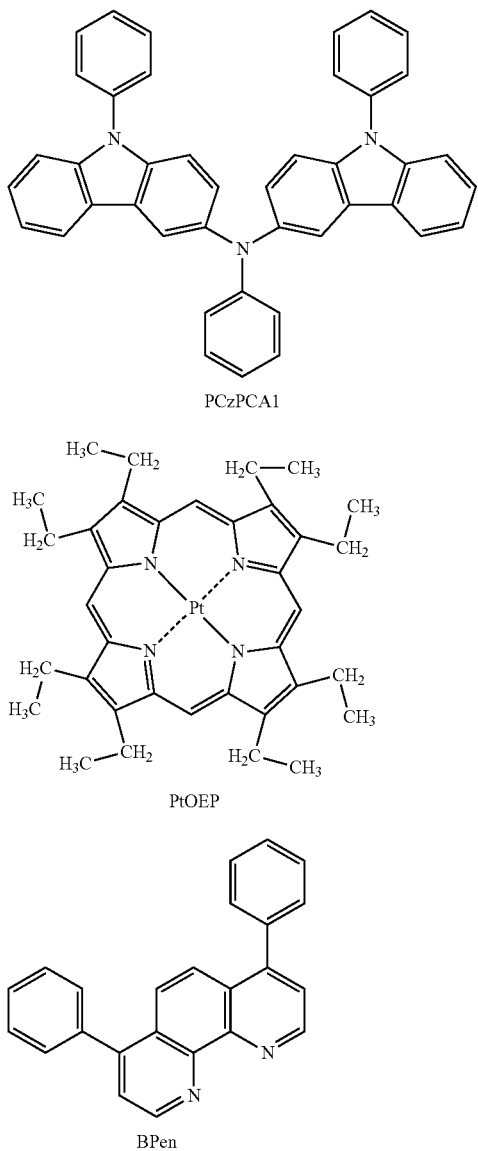

(iv) PCzPCA1

(v) PtOEP (vi) BPen

Methods for fabricating a light-emitting element 1 and a comparative light-emitting element 1 are described below.

(Method for Fabricating Light-Emitting Element 1)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 20 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, over the hole-transport layer 112, the light-emitting layer 113 was formed by co-evaporation of 2-[3'-(dibenzothiophen-4-yl)biphenyl-3-yl]dibenzo[f,h]quinoxaline (abbreviation: 2mDBTBPDBq-II) represented by Structural Formula (iii), 3-[N-(9-phenylcarbazol-3-yl)-N-phenylamino]-9-phenylcarbazole (abbreviation: PCzPCA1) represented by Structural Formula (iv), and platinum(II) octaethylporphyrin (abbreviation: PtOEP) represented by Structural Formula (v) with a weight ratio of 0.8:0.2:0.05 (=2mDBTBPDBq-II:PCzPCA1:PtOEP) to a thickness of 40 nm.

Then, the electron-transport layer 114 was formed over the light-emitting layer 113 in such a way that a 20 nm thick film of 2mDBTBPDBq-II was formed and a 15 nm thick film of bathophenanthroline (abbreviation: BPhen) represented by Structural Formula (vi) was formed.

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting element 1 in this example was fabricated.

Note that in all the above evaporation steps, evaporation was performed by a resistance-heating method.

(Method for Fabricating Comparative Light-Emitting Element 1)

The comparative light-emitting element 1 was fabricated in the same manner as the light-emitting element 1 except the light-emitting layer 113 was formed by co-evaporation of 2mDBTBPDBq-II and PtOEP with a weight ratio of 0.8:0.05 (=2mDBTBPDBq-II:PtOEP) to a thickness of 40 nm. The other materials and components are the same as those of the light-emitting element 1.

The light-emitting element 1 and the comparative light-emitting element 1 were each sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing). Then, initial characteristics of these light-emitting elements were measured. Note that the measurements were carried out at room temperature (in an atmosphere kept at 25° C.).

Figure 15:
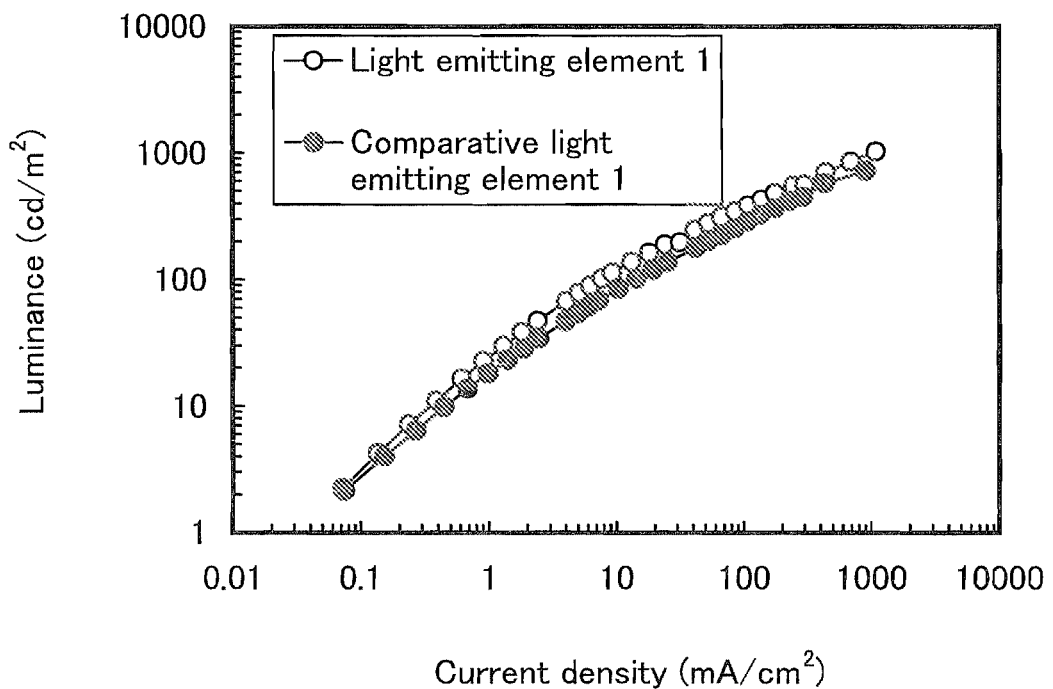
FIG. 15 shows current density-luminance characteristics of a light-emitting element 1 and a comparative light-emitting element 1.
Figure 16:
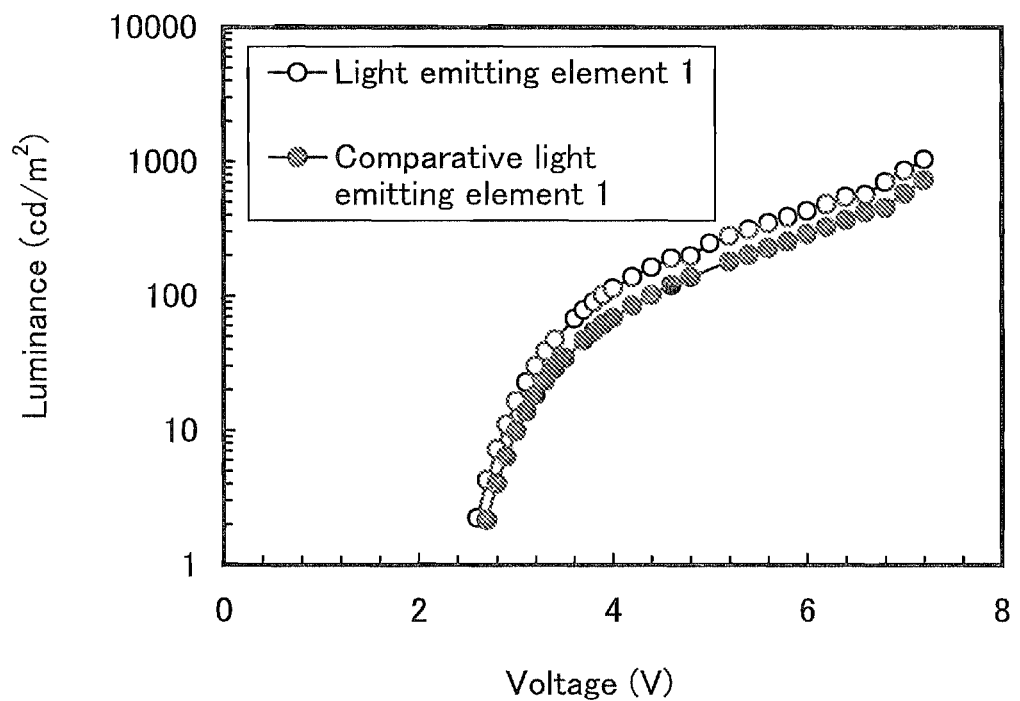
FIG. 16 shows voltage-luminance characteristics of the light-emitting element 1 and the comparative light-emitting element 1.
Figure 17:
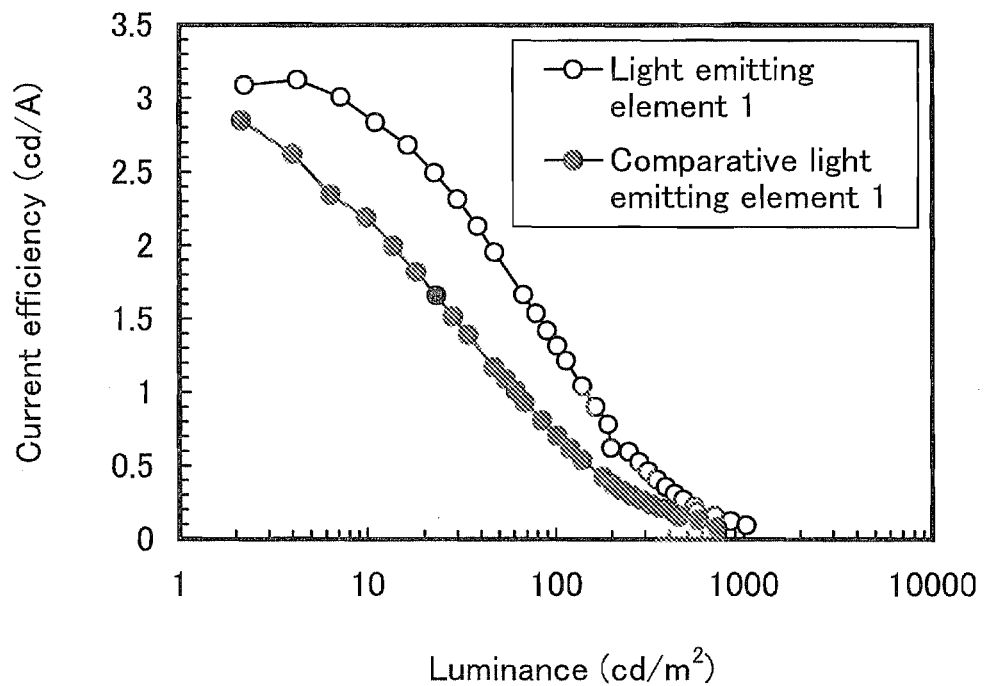
FIG. 17 shows luminance-current efficiency characteristics of the light-emitting element 1 and the comparative light-emitting element 1.
Figure 18:
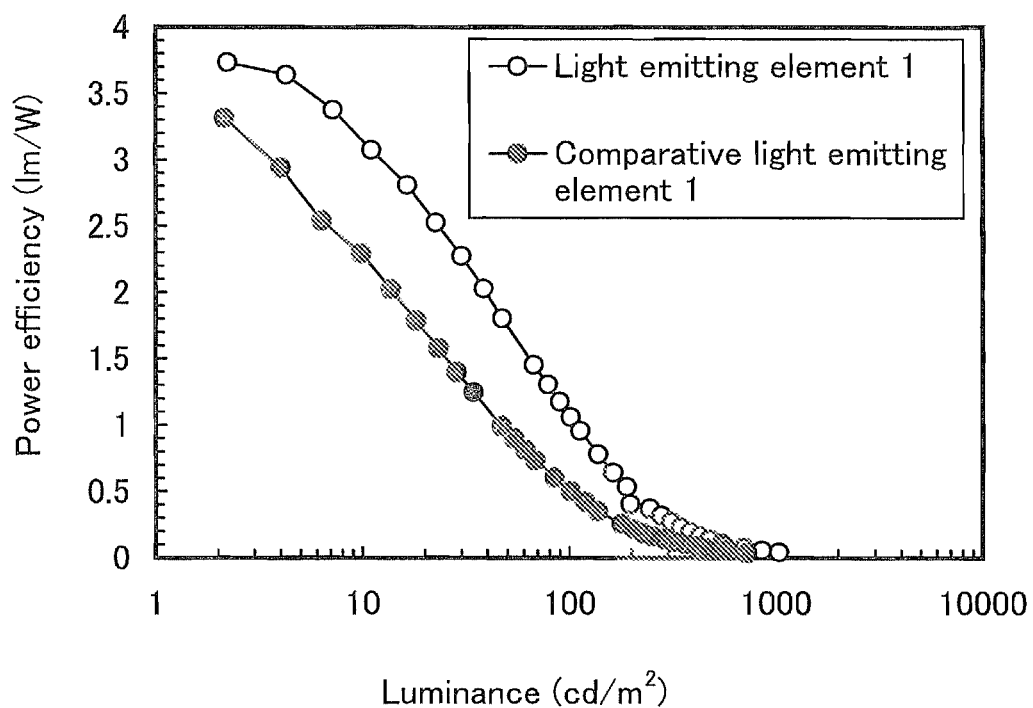
FIG. 18 shows luminance-power efficiency characteristics of the light-emitting element 1 and the comparative light-emitting element 1.
Figure 19:
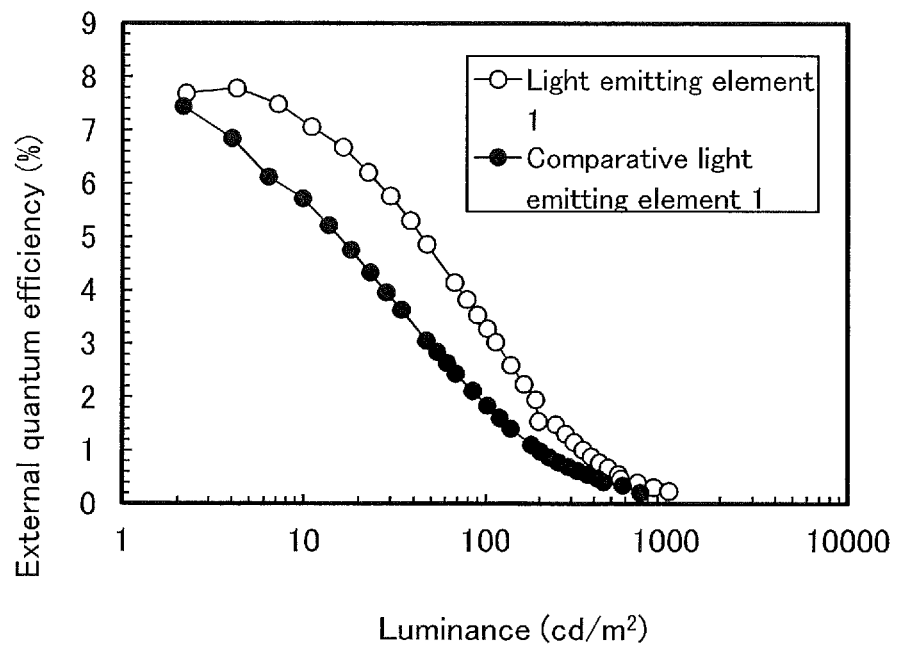
FIG. 19 shows luminance-external quantum efficiency characteristics of the light-emitting element 1 and the comparative light-emitting element 1.
Figure 20:
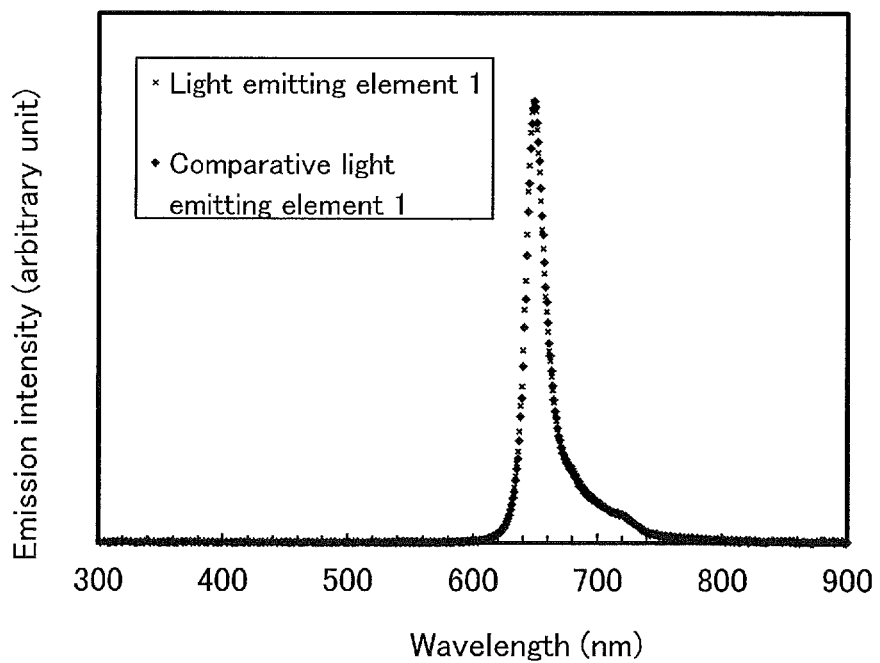
FIG. 20 shows emission spectra of the light-emitting element 1 and the comparative light-emitting element 1.

FIG. 15 shows current density-luminance characteristics of the light-emitting element 1 and the comparative light-emitting element 1; FIG. 16 shows voltage-luminance characteristics thereof; FIG. 17 shows luminance-current efficiency characteristics thereof; FIG. 18 shows luminance-power efficiency characteristics thereof; FIG. 19 shows luminance-external quantum efficiency characteristics thereof; and FIG. 20 shows emission spectra thereof.

The figures show that the light-emitting element 1 which utilizes energy transfer from an exciplex exhibits better characteristics than the comparative light-emitting element 1 which does not utilize the energy transfer. Specifically, as a result of an increase in external quantum efficiency and a decrease in voltage, the power efficiency and the current efficiency are increased significantly. This confirms the superiority of the light-emitting element 1 that is one embodiment of the present invention.

Example 2

In this example, a light-emitting element corresponding to one embodiment of the present invention is described, in which zinc(II) octaethylporphyrin (abbreviation: ZnOEP) is used as a substance exhibiting thermally activated delayed fluorescence. Substances used in this example are shown below.

(i)

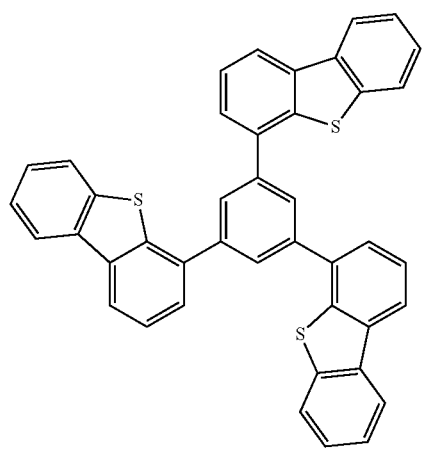

DBT3P-II (ii)

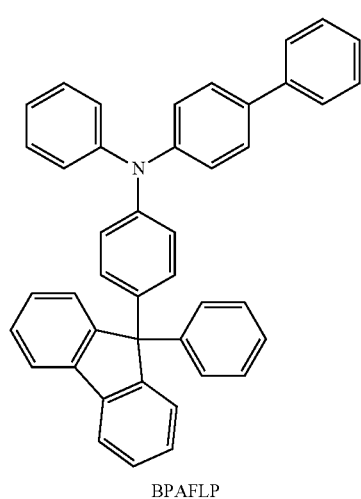

BPAFLP (iii)

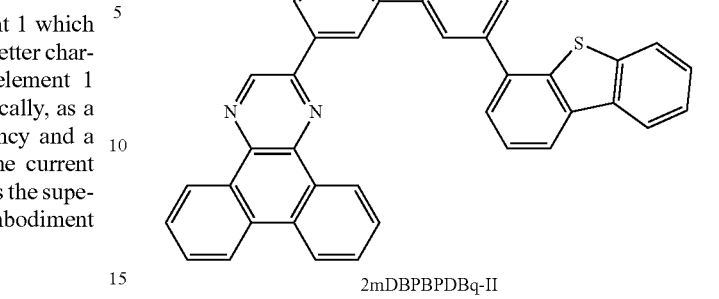

2mDBPBPDBq-II (vii)

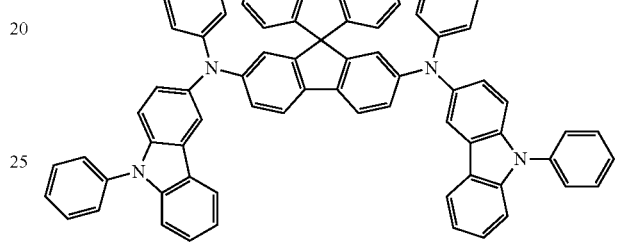

PCA2SF (viii)

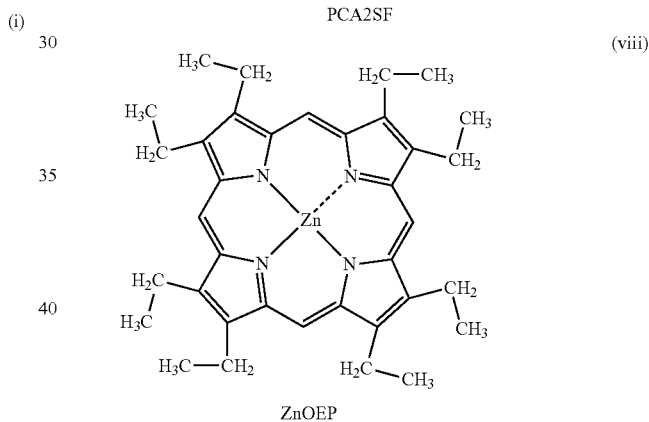

ZnOEP (vi)

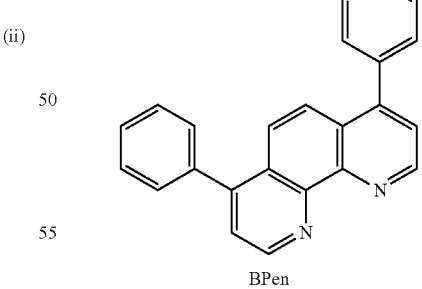

BPen

Methods for fabricating a light-emitting element 2 and a comparative light-emitting element 2 are described below.

(Method for Fabricating Light-Emitting Element 2)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for one hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 20 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Further, over the hole-transport layer 112, the light-emitting layer 113 was formed by co-evaporation of 2-[3'-(dibenzothiophen-4-yl)biphenyl-3-yl]dibenzo[f,h]quinoxaline (abbreviation: 2mDBTBPDBq-II) represented by Structural Formula (iii), N,N'-bis(9-phenyl-9H-carbazol-3-yl)-N,N'-diphenyl-spiro-9,9'-bifluorene-2,7-diamine (abbreviation: PCA2SF) represented by Structural Formula (vii), and zinc (II) octaethylporphyrin (abbreviation: ZnOEP) represented by Structural Formula (viii) with a weight ratio of 0.8:0.2:0.01 (=2mDBTBPDBq-II:PCA2SF:ZnOEP) to a thickness of 40 nm.

Then, the electron-transport layer 114 was formed over the light-emitting layer 113 in such a way that a 20 nm thick film of 2mDBTBPDBq-II was formed and a 10 nm thick film of bathophenanthroline (abbreviation: BPhen) represented by Structural Formula (vi) was formed.

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting element 2 in this example was fabricated.

Note that in all the above evaporation steps, evaporation was performed by a resistance-heating method.

(Method for Fabricating Comparative Light-Emitting Element 2)

The comparative light-emitting element 2 was fabricated in the same manner as the light-emitting element 2 except the light-emitting layer 113 was formed by co-evaporation of 2mDBTBPDBq-II and ZnOEP with a weight ratio of 1:0.01 (=2mDBTBPDBq-II:ZnOEP) to a thickness of 40 nm. The other materials and components are the same as those of the light-emitting element 2.

The light-emitting element 2 and the comparative light-emitting element 2 were each sealed using a glass substrate in a glove box containing a nitrogen atmosphere so as not to be exposed to the air (specifically, a sealing material was applied onto an outer edge of the element and heat treatment was performed at 80° C. for 1 hour at the time of sealing). Then, initial characteristics of these light-emitting elements were measured. Note that the measurements were carried out at room temperature (in an atmosphere kept at 25° C.).

Figure 21:
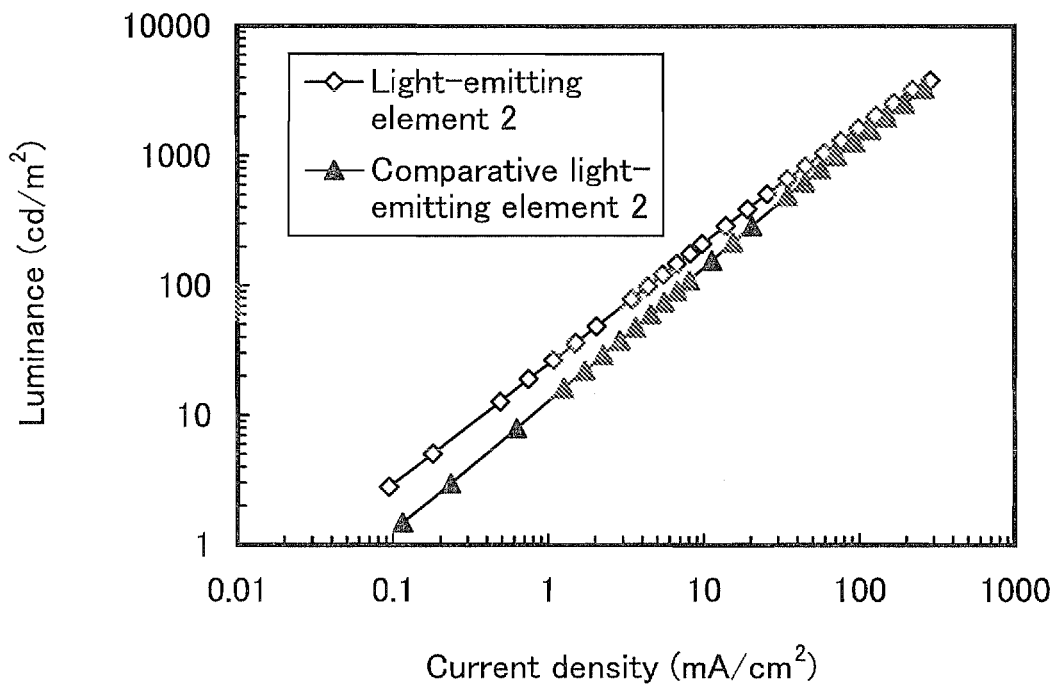
FIG. 21 shows current density-luminance characteristics of a light-emitting element 2 and a comparative light-emitting element 2.
Figure 22:
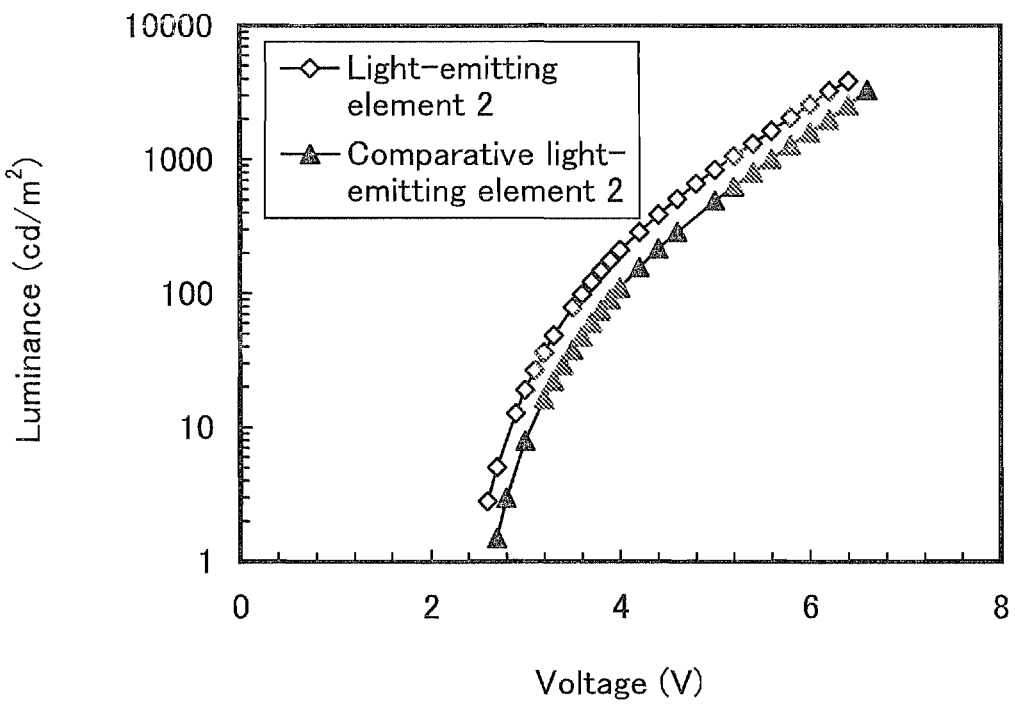
FIG. 22 shows voltage-luminance characteristics of the light-emitting element 2 and the comparative light-emitting element 2.
Figure 23:
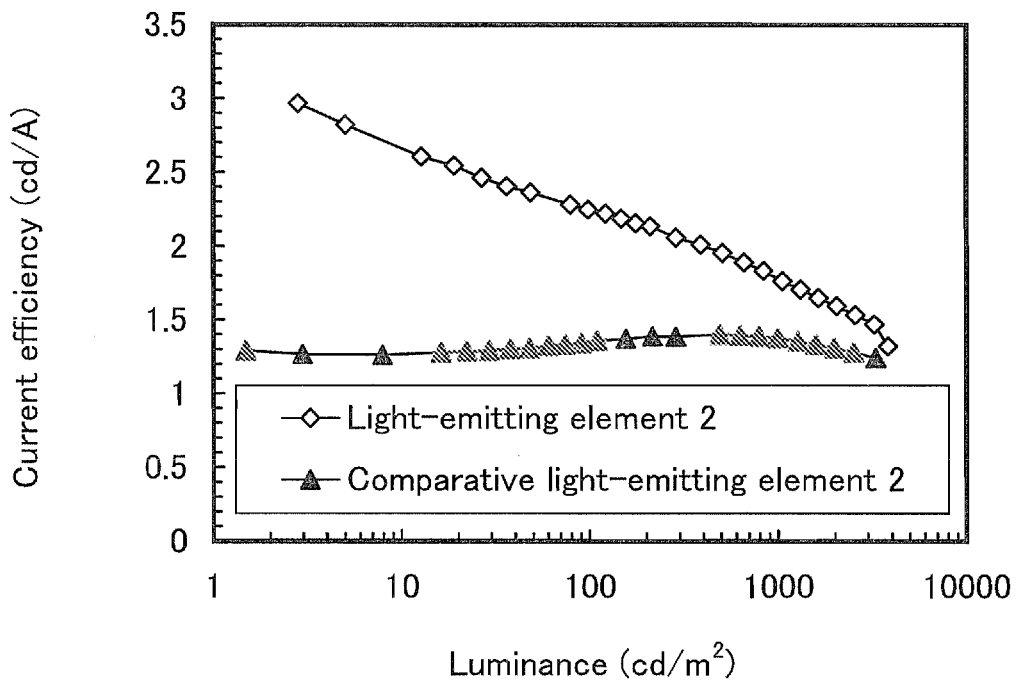
FIG. 23 shows luminance-current efficiency characteristics of the light-emitting element 2 and the comparative light-emitting element 2.
Figure 24:
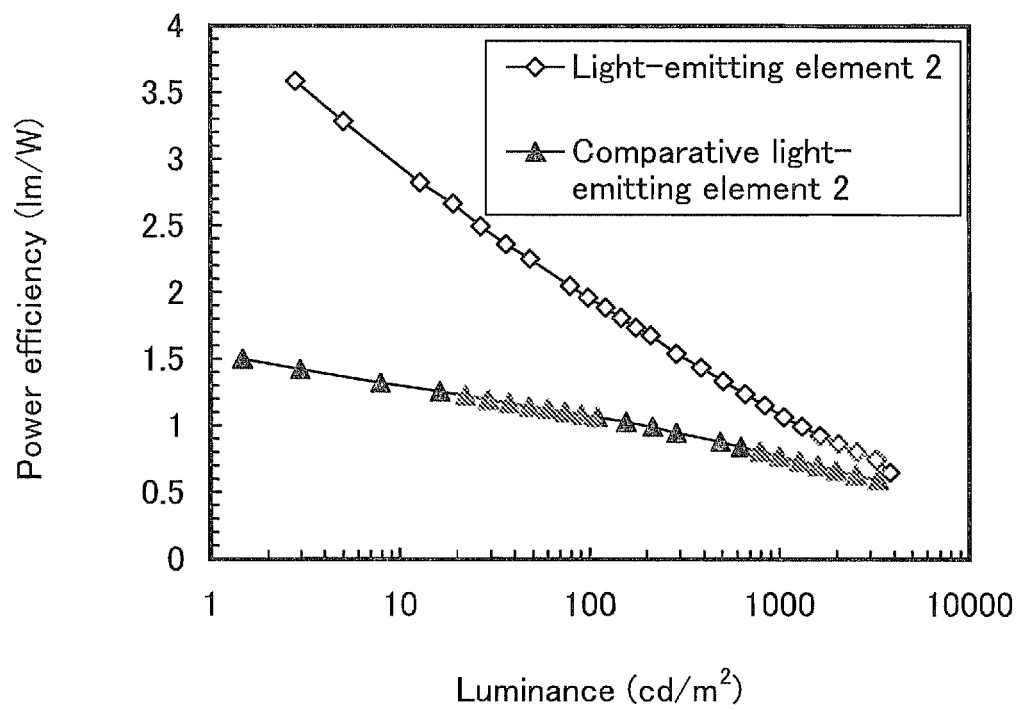
FIG. 24 shows luminance-power efficiency characteristics of the light-emitting element 2 and the comparative light-emitting element 2.
Figure 25:
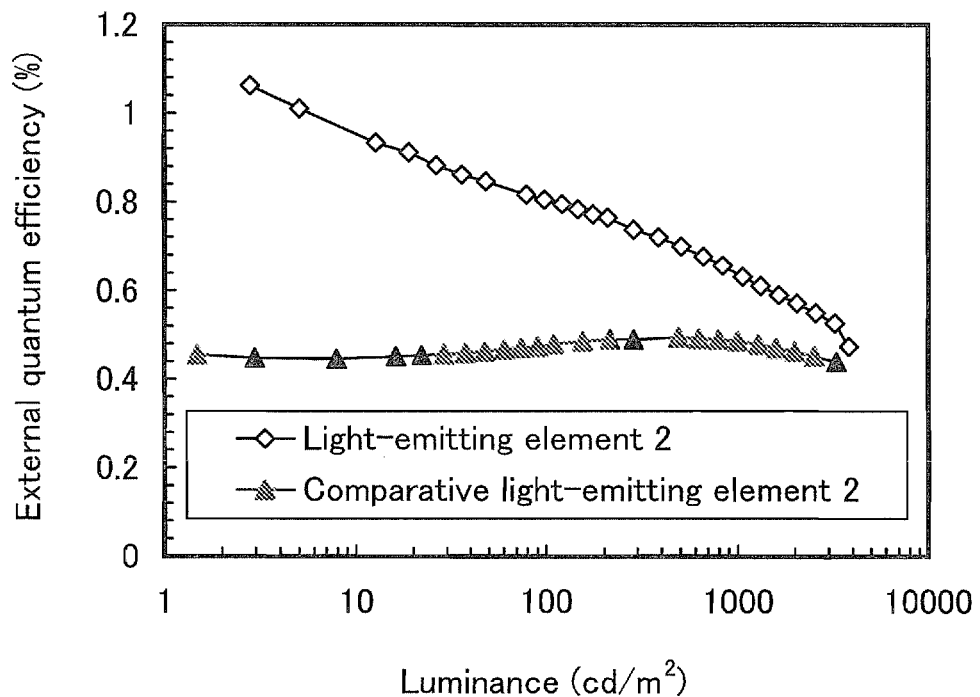
FIG. 25 shows luminance-external quantum efficiency characteristics of the light-emitting element 2 and the comparative light-emitting element 2.
Figure 26:
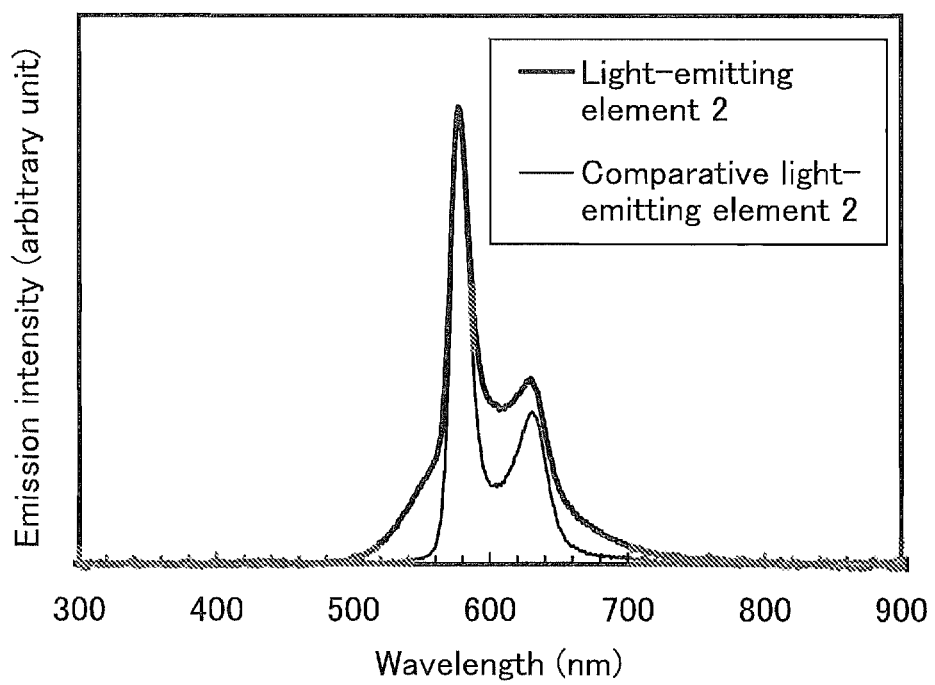
FIG. 26 shows emission spectra of the light-emitting element 2 and the comparative light-emitting element 2.

FIG. 21 shows current density-luminance characteristics of the light-emitting element 2 and the comparative light-emitting element 2; FIG. 22 shows voltage-luminance characteristics thereof; FIG. 23 shows luminance-current efficiency characteristics thereof; FIG. 24 shows luminance-power efficiency characteristics thereof; FIG. 25 shows luminance-external quantum efficiency characteristics thereof; and FIG. 26 shows emission spectra thereof.

The figures show that the light-emitting element 2 which utilizes energy transfer from an exciplex exhibits better characteristics than the comparative light-emitting element 2 which does not utilize the energy transfer. Specifically, as a result of an increase in external quantum efficiency and a decrease in voltage, the power efficiency and the current efficiency are increased significantly. This confirms the superiority of the light-emitting element 2 that is one embodiment of the present invention.

This application is based on Japanese Patent Application serial no. 2012-114276 filed with Japan Patent Office on May 18, 2012, the entire contents of which are hereby incorporated by reference.

What is claimed is:

1. A light-emitting device comprising:
   a pair of electrodes; and
   a light-emitting layer between the pair of electrodes, the light-emitting layer comprising a first organic compound, a second organic compound, and a light-emitting substance which exhibits thermally activated delayed fluorescence,
   wherein an emission of an exciplex of the first organic compound and the second organic compound overlaps with an absorption band of the light-emitting substance.

2. The light-emitting device according to claim 1, wherein the emission overlaps with the absorption band on the lowest energy side.

3. The light-emitting device according to claim 2, wherein a difference in energy between a peak wavelength of the absorption band and a peak wavelength of the emission is 0.2 eV or less.

4. The light-emitting device according to claim 1, wherein a difference in energy between peak wavelengths of fluorescence and phosphorescence of the light-emitting substance is 0.2 eV or less.

5. The light-emitting device according to claim 1, wherein the first organic compound has an electron-transport property, and the second organic compound has a hole-transport property.

6. The light-emitting device according to claim 1, wherein the first organic compound is a π-deficient heteroaromatic compound, and the second organic compound is a π-excessive heteroaromatic compound or an aromatic amine compound.

7. An electronic device comprising the light-emitting device according to claim 1.

8. A lighting device comprising the light-emitting device according to claim 1.

9. A light-emitting device comprising:
a pair of electrodes; and
a light-emitting layer between the pair of electrodes, the light-emitting layer comprising a first organic compound, a second organic compound, and a light-emitting substance which exhibits thermally activated delayed fluorescence,
wherein a difference in energy between peak wavelengths of fluorescence and phosphorescence of the light-emitting substance is 0.2 eV or less, and
wherein the light-emitting substance comprises a π-excessive heteroaromatic ring and a π-deficient heteroaromatic ring.

10. The light-emitting device according to claim 9, wherein a difference in equivalent energy between peak wavelengths of fluorescence and phosphorescence of an exciplex of the first organic compound and the second organic compound is 0.2 eV or less.

11. The light-emitting device according to claim 9, wherein the first organic compound has an electron-transport property, and the second organic compound has a hole-transport property.

12. The light-emitting device according to claim 9, wherein the first organic compound is a π-deficient heteroaromatic compound, and the second organic compound is a π-excessive heteroaromatic compound or an aromatic amine compound.

13. An electronic device comprising the light-emitting device according to claim 9.

14. A lighting device comprising the light-emitting device according to claim 9.

* * * * *

UNITED STATES PATENT AND TRADEMARK OFFICE
CERTIFICATE OF CORRECTION

Page 1 of 1

PATENT NO. : 8,994,013 B2
APPLICATION NO. : 13/892667
DATED : March 31, 2015
INVENTOR(S) : Satoshi Seo It is certified that error appears in the above-identified patent and that said Letters Patent is hereby corrected as shown below:

In the Specification
At column 14, line 45, "1,2,4triazole" should be --1,2,4-triazole--;
At column 15, line 16, "PCBAlBP)," should be --PCBA1BP),--;
At column 15, line 18, "PCBBilBP)," should be --PCBBi1BP),--;
At column 15, line 31, "(d ibenzothiophene)" should be --(dibenzothiophene)--;
At column 15, line 37, "DBF3 P-II)" should be --DBF3P-II)--;
At column 15, line 61, "foil" should be --form--;
At column 21, line 48, "(4-tent-butylphenyl)" should be --(4-*tert*-butylphenyl)--;
At column 24, line 18, "faulted" should be --formed--;
At column 25, line 24, "fanned" should be --formed--;
At column 26, line 9, "10246" should be --1024G,--;
At column 26, line 61, "10348," should be --1034R,--;
At column 27, line 2, "10448," should be --1044R,--;

In the Claims
In claim 10, at column 41, line 15, "in equivalent energy" should be --in energy--.

Signed and Sealed this
Eighth Day of September, 2015

Michelle K. Lee
*Director of the United States Patent and Trademark Office*